(12) United States Patent
Iizuka et al.

(10) Patent No.: US 7,271,835 B2
(45) Date of Patent: Sep. 18, 2007

(54) SOLID-STATE IMAGE PICKUP DEVICE AND DEVICE DRIVING CONTROL METHOD FOR SOLID-STATE IMAGE PICKUP

(75) Inventors: Tetsuya Iizuka, Kanagawa (JP); Takahisa Ueno, Kanagawa (JP)

(73) Assignee: Sony Corporation, Tokyo (JP)

( * ) Notice: Subject to any disclaimer, the term of this patent is extended or adjusted under 35 U.S.C. 154(b) by 792 days.

(21) Appl. No.: 10/655,156

(22) Filed: Sep. 4, 2003

(65) Prior Publication Data
US 2004/0051801 A1 Mar. 18, 2004

(30) Foreign Application Priority Data
Sep. 18, 2002 (JP) .............................. 2002-271025

(51) Int. Cl.
*H04N 3/14* (2006.01)
(52) U.S. Cl. ...................................... 348/314; 348/294
(58) Field of Classification Search ...................... None
See application file for complete search history.

(56) References Cited

U.S. PATENT DOCUMENTS

| | | | | |
|---|---|---|---|---|
| 4,839,735 A | * | 6/1989 | Kyomasu et al. ........... | 348/297 |
| 5,471,246 A | * | 11/1995 | Nishima et al. ............ | 348/322 |
| 5,623,306 A | * | 4/1997 | Kajihara et al. ............ | 348/314 |
| 5,986,297 A | | 11/1999 | Guidash et al. | |
| 6,166,768 A | * | 12/2000 | Fossum et al. ............. | 348/308 |
| 6,667,768 B1 | * | 12/2003 | Fossum ...................... | 348/308 |
| 7,002,626 B2 | * | 2/2006 | Pain et al. .................. | 348/241 |

* cited by examiner

*Primary Examiner*—David Ometz
*Assistant Examiner*—Luong T. Nguyen
(74) *Attorney, Agent, or Firm*—Robert J. Depke; Rockey, Depke & Lyons, LLC.

(57) ABSTRACT

Disclosed herein is a solid-state image pickup device including: a plurality of unit pixels each having: a charge generating section for generating a charge, a charge storage section for storing the charge generated by the charge generating section, a transfer gate section disposed between the charge generating section and the charge storage section for transferring the charge generated by the charge generating section to the charge storage section, and a pixel signal generating section for generating a pixel signal corresponding to the charge stored in the charge storage section; an unnecessary charge discharging gate section in each the unit pixel, switchable to block a flow of an unnecessary charge that is generated in the charge generating section and does not contribute to image formation, according to height of an electric barrier; and an unnecessary charge drain section disposed on an opposite side of the unnecessary charge discharging gate section from the charge generating section for receiving the unnecessary charge swept out of the charge generating section through the unnecessary charge discharging gate section.

20 Claims, 11 Drawing Sheets

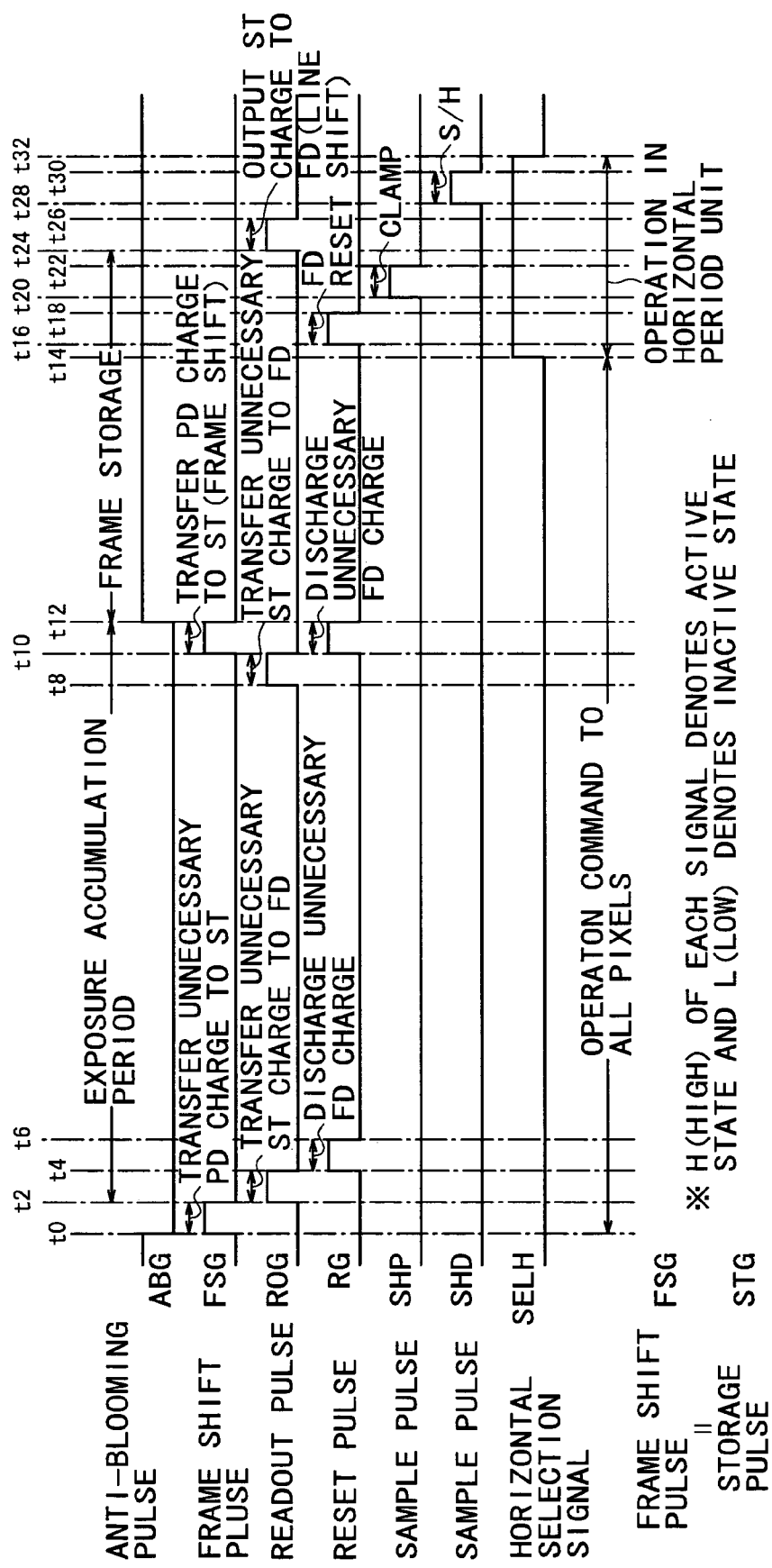

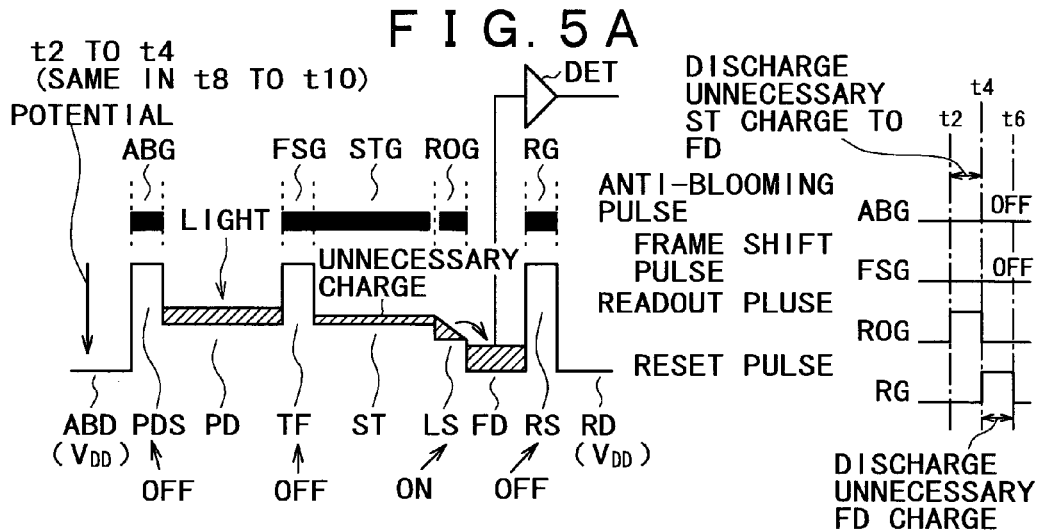
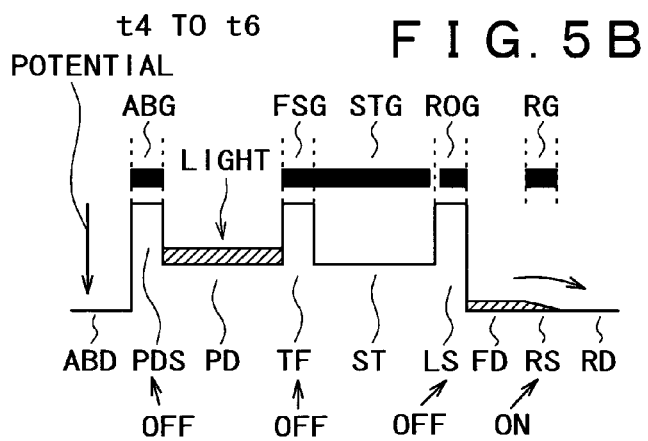
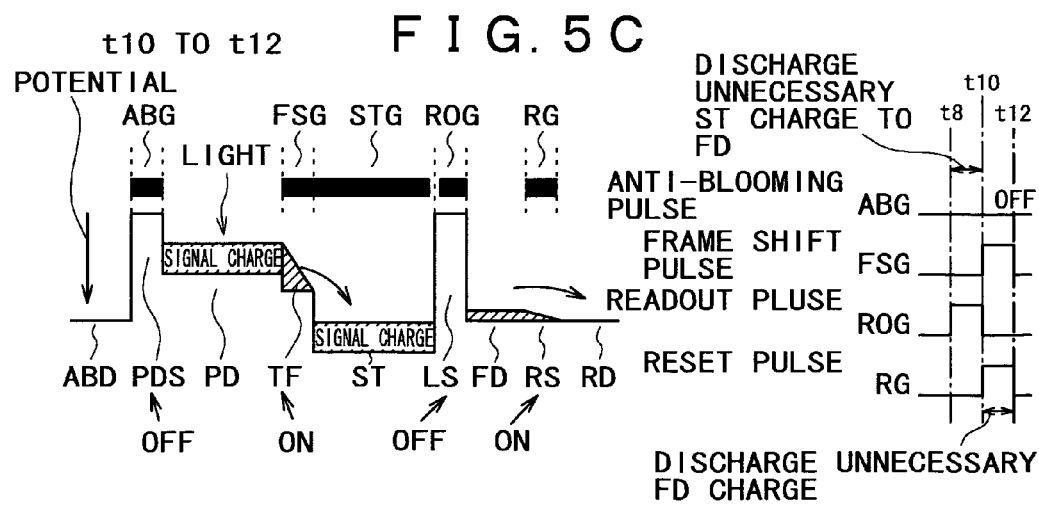

SOLID-STATE IMAGE PICKUP DEVICE AND DEVICE DRIVING CONTROL METHOD FOR SOLID-STATE IMAGE PICKUP

This application claims priority to Japanese Patent Application Numbers JP2002-271025 filed Sep. 18, 2002 which is incorporated herein by reference.

BACKGROUND OF THE INVENTION

The present invention relates to a solid-state image pickup device formed with an image pickup element having a plurality of unit pixels arranged therein and a driving control method for the solid-state image pickup device, and more particularly to a technique for discharging unnecessary charge in a solid-state image pickup device of a MOS type, a CMOS type or the like in which a pixel signal from a unit pixel is read by address control.

As solid-state image pickup devices of a system that reads pixel signals from charge generating sections including a plurality of photoelectric converting elements (photodiodes or the like) within an image pickup unit by controlling a pixel position by address control, there are solid-state image pickup devices of a MOS type and a CMOS type (which will hereinafter be typified by the MOS type for description unless otherwise specified). For example a solid-state image pickup device having unit pixels disposed in a form of a two-dimensional matrix is referred to as an X-Y address type solid-state image pickup device.

The address type solid-state image pickup device uses MOS transistors as a switching element for selecting a pixel and as a switching element for reading signal charge, for example. MOS transistors are also used for a horizontal scanning circuit and a vertical scanning circuit, thus having an advantage of being able to be fabricated in a series of structures with the switching elements.

Each unit pixel in the MOS type solid-state image pickup device, for example, is formed with MOS transistors, and is configured to output a signal charge accumulated in the pixel by photoelectric conversion to a pixel signal generating section, convert the signal charge into a current signal or a voltage signal, and then output the current signal or the voltage signal.

The pixel signal generating section provides an output signal in substantially linear relation to an amount of charge accumulated in the unit pixel by photoelectric conversion. An amount of charge that can be accumulated in the unit pixel determines a dynamic range of the image pickup element, or the dynamic range of the image pickup element is determined by a saturation signal amount of the pixel and a noise level.

Some MOS type image pickup devices of the X-Y address type having conventional unit pixels arranged two-dimensionally in the form of a matrix reset (discharge) unnecessary signal charge from a row of pixels to a signal line in a horizontal blanking period when signal charge is not read, for example, to perform electronic shutter operation.

The shutter speed of an electronic shutter, that is, a time corresponding to an accumulation time of a pixel is determined by a period from a point in time of discharge of signal charge to a point in time of reading of signal charge. Hence the accumulation time differs between the right and the left in a horizontal direction. That is, the accumulation time of a pixel outputted by a horizontal scanning pulse varies in proportion to timing of output of the pixel.

The difference in the accumulation time can be ignored when the shutter speed is slow and the accumulation time of the pixel is set sufficiently long. However, when the shutter speed is set fast to a degree that the shutter speed is not so different from a horizontal scanning period of the shutter speed, the difference in the accumulation time appears as shading in a line direction (horizontal direction) in an image, thus presenting a problem.

In order to solve this problem, a structure has been proposed to realize a function referred to as a global shutter function in which the exposure accumulation time of each pixel is constant (simultaneous exposure) when the electronic shutter operation is performed. For example, a structure has been proposed in which a charge storage section is provided between a charge generating section and a pixel signal generating section in each pixel, so that after simultaneous exposure of all pixels to light, a signal charge generated in the charge generating section is transferred simultaneously to the charge storage section (see for example U.S. Pat. No. 5,986,297).

In this system, a signal charge generated as a result of light entering a photoelectric converting element of the charge generating section is transferred to the charge storage section simultaneously in all the pixels and temporarily stored in the charge storage section. The signal charge is sequentially converted into a pixel signal in predetermined readout timing. Also, in this system, a charge accumulated in the charge generating section as a result of light entering the photoelectric converting element of the charge generating section after the transfer is discharged prior to a next exposure accumulation.

Thereby, a pixel signal corresponding to the amount of signal charge stored in the charge storage section is obtained, and the electronic shutter function without a difference in exposure accumulation time can be realized by adjusting timing of transfer to the charge storage section after exposure.

However, when intense light enters the photoelectric converting element of the charge generating section, a so-called "blooming phenomenon" becomes a problem, in which phenomenon a charge more than a maximum amount of charge that can be accumulated in the photoelectric converting element is generated, and the charge overflows the photoelectric converting element through a transfer gate or a channel stop region into the pixel signal generating section or a charge generating section within an adjacent pixel or the like. The blooming phenomenon also occurs in the structure for realizing the global shutter function by transferring a signal charge obtained in the photoelectric converting element to the charge storage section simultaneously in all the pixels, for example.

When the blooming phenomenon occurs, a white band-shaped or white circle-shaped pattern is observed in a picked-up image, degrading picture quality. In the structure for realizing the global shutter function with the charge storage section, in particular, an excess charge generated in the charge generating section overflows into the charge storage section within its pixel. Since a pixel signal is obtained according to an amount of signal charge stored in the charge storage section, as described above, the blooming phenomenon varies a signal component of the pixel itself. Furthermore, when a charge generated as a result of light entering the photoelectric converting element after a signal charge is transferred to the charge storage section overflows into the charge storage section, a problem (quasi-blooming phenomenon) similar to the blooming phenomenon occurs.

SUMMARY OF THE INVENTION

The present invention has been made in view of the above, and it is accordingly an object of the present invention to provide a solid-state image pickup device and a driving control method for the solid-state image pickup device that make it possible to suppress the blooming phenomenon and the quasi-blooming phenomenon with a simple structure and a simple control method.

Specifically, according to the present invention, there is provided a solid-state image pickup device including a plurality of unit pixels each having: a charge generating section for generating a charge, a charge storage section for storing the charge generated by the charge generating section, a transfer gate section disposed between the charge generating section and the charge storage section, for transferring the charge generated by the charge generating section to the charge storage section, and a pixel signal generating section for generating a pixel signal corresponding to the charge stored in the charge storage section; an unnecessary charge discharging gate section disposed adjacent to the charge generating section in each unit pixel, the unnecessary charge discharging gate section being switchable to block a flow of an unnecessary charge that is generated in the charge generating section and does not contribute to image formation, according to height of an electric barrier; and an unnecessary charge drain section disposed on an opposite side of the unnecessary charge discharging gate section from the charge generating section, for receiving the unnecessary charge swept out of the charge generating section through the unnecessary charge discharging gate section. A power supply unit, for example, may be used as the unnecessary charge drain section.

According to the present invention, there is provided a driving control method for a solid-state image pickup device, or a method for driving control of the solid-state image pickup device according to the present invention, the method including the steps of: turning off the unnecessary charge discharging gate section to heighten the electric barrier during a time of exposure accumulation, which is a period when a charge generated by the charge generating section being exposed to light is accumulated in the charge generating section; and turning on the unnecessary charge discharging gate section to lower the electric barrier during a period other than the time of exposure accumulation.

Inventions as set forth in dependent claims further define advantageous concrete examples of the solid-state image pickup device and the driving control method for the solid-state image pickup device according to the present invention.

For example, the solid-state image pickup device may have a global shutter function in which the transfer gate section transfers the charge generated by the charge generating section to the charge storage section simultaneously in a plurality of unit pixels (preferably all the pixels).

The pixel signal generating section may include a charge injection section such as a floating diffusion (FD); a readout gate section for controlling injection of the charge into the charge injection section; a detecting element for detecting change in potential of the charge injection section; a reset drain section for receiving the charge injected into the charge injection section; and a reset gate section for resetting the potential of the charge injection section by discharging the signal charge injected into the charge injection section to the reset drain section in predetermined timing.

In the unit pixel, the charge injection section may also serve as the charge storage section.

Further, the solid-state image pickup device according to the present invention may further comprise a driving control unit for driving control of the unnecessary charge discharging gate section of the unit pixel, the driving control unit being formed integrally with the unit pixel. The driving control unit controls the height of the electric barrier at the unnecessary charge discharging gate section by changing magnitude of a voltage applied to the unnecessary charge discharging gate section in predetermined timing.

Further, the driving control unit effects control to change the magnitude of the voltage, that is, effects on-off control of the unnecessary charge discharging gate section such that the electric barrier is high during a time of exposure accumulation, which is a period when the charge generated by the charge generating section being exposed to light is accumulated in the charge generating section, and the electric barrier is low during a period other than the time of exposure accumulation.

In particular, the driving control unit preferably sets the magnitude of the voltage applied to the unnecessary charge discharging gate section, that is, effects on-off control of the unnecessary charge discharging gate section such that the electric barrier of the unnecessary charge discharging gate section is higher in height than an electric barrier of the transfer gate section during a period of transfer of the charge from the charge generating section to the charge storage section and the electric barrier of the unnecessary charge discharging gate section is lower in height than the electric barrier of the transfer gate section during a major part of a period other than the time of exposure accumulation.

Further, the driving control unit preferably sets the magnitude of the voltage, that is, effects on-off control of the unnecessary charge discharging gate section such that the electric barrier of the unnecessary charge discharging gate section during the time of exposure accumulation is higher in height than an electric barrier of the transfer gate section during the time of exposure accumulation.

Further, in the solid-state image pickup device according to the present invention, each gate section preferably forms a state of storing a charge of an opposite conduction type from the charge generated by the charge generating section at a channel surface of the gate section at an off time of the gate section.

Further, the transfer gate section in the solid-state image pickup device according to the present invention may have a transfer gate electrode to which a pulse signal for driving control of the transfer gate section is applied, the charge storage section may have a storage gate electrode to which a pulse signal for driving control of the charge storage section is applied, and the transfer gate electrode and the storage gate electrode may be formed as a commonly used single-gate electrode. In this case, a voltage potential difference is formed in a part corresponding to the transfer gate electrode and the storage gate electrode by predetermined means such as by varying an impurity dose or varying film thickness of the gate electrodes.

In on-off driving of each gate section of the solid-state image pickup device according to the present invention, the following timing is preferable.

For example, a well for charge is preferably formed with the charge generating section at a center of the well by turning off the unnecessary charge discharging gate section and the transfer gate section prior to exposure accumulation in the charge generating section.

Also, prior to exposure accumulation, the charge generating section is preferably reset by discharging a charge accumulated in the charge generating section at that point in time to at least one of the charge storage section and the unnecessary charge discharging gate section.

Further, preferably, a signal charge that is the charge accumulated in the charge generating section at the time of exposure accumulation is transferred to the charge storage section by turning on the transfer gate section, and the unnecessary charge discharging gate section is turned on after a start of transfer of the signal charge.

Further, the transfer gate section is preferably turned off after the transfer of the signal charge to the charge storage section.

Further, more preferably, the charge storage section is reset by discharging a charge stored in the charge storage section prior to transfer of the signal charge to the charge storage section.

Further, the charge generating section does not need to be reset when the unnecessary charge discharging gate section is in an on state. That is, control may be effected such that a charge well is formed with the charge generating section at a center of the well.

As described above, according to the present invention, the unnecessary charge discharging gate section switchable to block a flow of unnecessary charge generated in the charge generating section according to voltage potential (height of an electric barrier) is provided on an opposite side of the charge generating section from the pixel signal generating section in each unit pixel.

Thereby, while the unnecessary charge discharging gate section is turned off during a period of exposure accumulation of the charge generating section so as not to affect the accumulation of signal charge, an excess charge generated by irradiating the charge generating section with excessive light during the period of exposure accumulation can be discharged over the unnecessary charge discharging gate section to the unnecessary charge drain section. It is thus possible to reduce picture degradation due to the excess charge. That is, it is possible to reduce the blooming phenomenon in the period of exposure accumulation.

On the other hand, by turning on the unnecessary charge discharging gate section during a period other than the period of exposure accumulation, it is possible to prevent unnecessary charge generated in the charge generating section during this period from entering the charge storage section. That is, it is possible to suppress the quasi-blooming phenomenon in the period other than the period of exposure accumulation.

Thus, according to the present invention, it is possible to suppress effects of unnecessary charge caused by the blooming phenomenon and the quasi-blooming phenomenon with a simple configuration in which the unnecessary charge discharging gate section is provided for each pixel.

BRIEF DESCRIPTION OF THE DRAWINGS

FIG. 3 is an example of a timing chart of scanning in the solid-state image pickup device having the unit pixel according to the first embodiment;

FIGS. 5A, 5B, and 5C are diagrams of assistance in explaining details of states of operation during a period of t2 to t4 and a period of t4 to t6 (periods of post-processing for the reset mode) in the timing chart shown in FIG. 3;

DETAILED DESCRIPTION OF THE PREFERRED EMBODIMENTS

Preferred embodiments of the present invention will hereinafter be described in detail with reference to the drawings. In the following, description will be made by taking as an example a case where the present invention is applied to a CMOS image pickup device as an example of an X-Y address type solid-state image pickup device.

Figure 1:
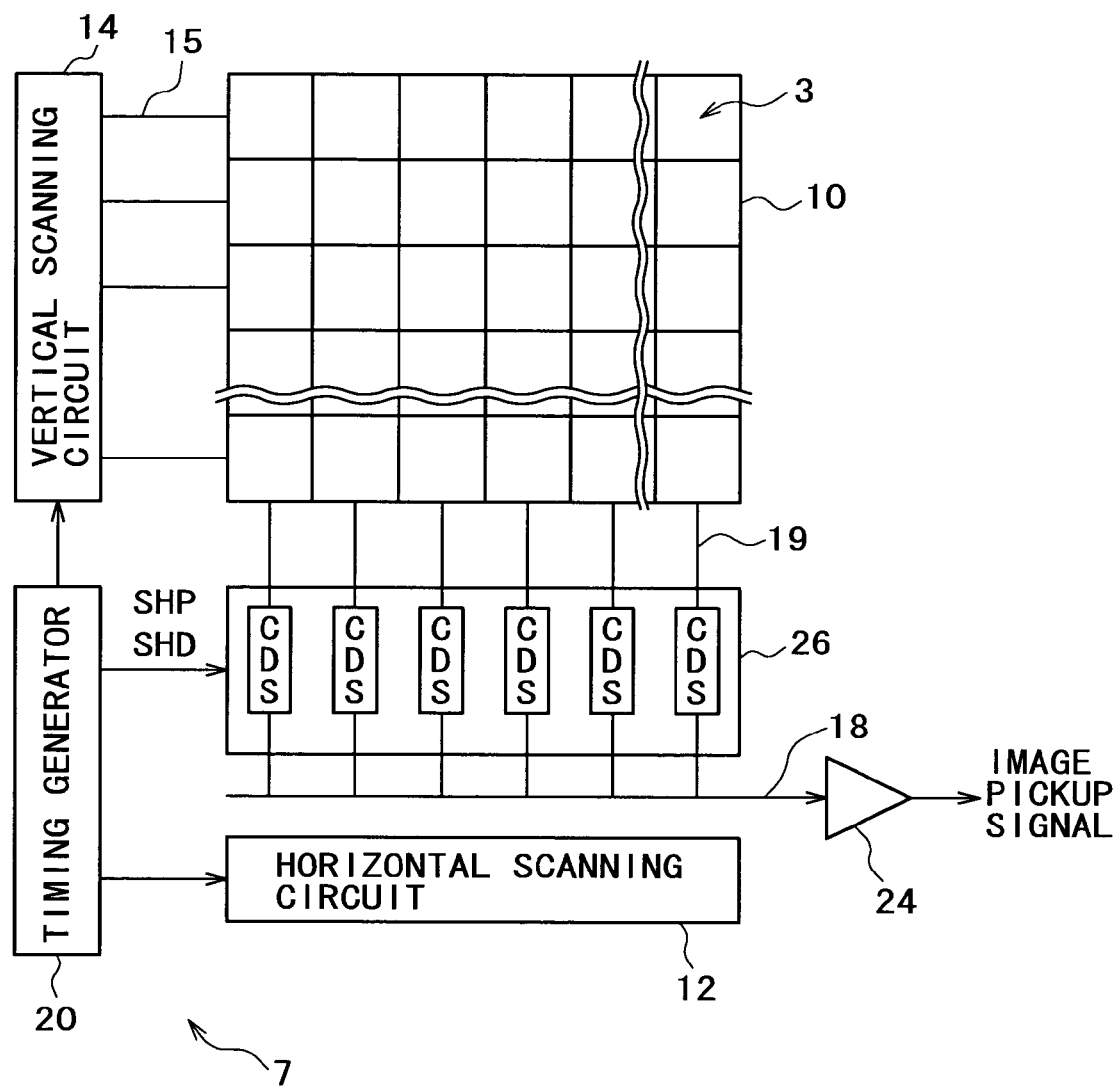
FIG. 1 is a schematic diagram of configuration of a solid-state image pickup device according to a first embodiment of the present invention.

FIG. 1 is a schematic diagram of configuration of a solid-state image pickup device according to a first embodiment of the present invention. The solid-state image pickup device 1 is a column type solid-state image pickup device in which pixels are arranged in a form of rows and columns, signal outputs from the pixels are outputted as voltage signals, and a CDS (Correlated Double Sampling) processing function unit is provided for each column.

Specifically, as shown in FIG. 1, the solid-state image pickup device 1 includes an image pickup unit 10 in which a plurality of unit pixels 3 are arranged in the form of rows and columns, a driving control unit 7 provided on the outside of the image pickup unit 10, and a CDS processing unit 26. A horizontal scanning circuit 12 and a vertical scanning circuit 14, for example, are provided as the driving control unit 7. While FIG. 1 does not show a part of the rows and columns for simplicity, several tens to several thousands of pixels are arranged in each row and each column in practice.

As another component of the driving control unit 7, a timing generator 20 is provided to supply pulse signals in predetermined timing to the horizontal scanning circuit 12, the vertical scanning circuit 14, and the CDS processing unit 26.

These components of the driving control unit 7 are formed integrally with the image pickup unit 10 in a semiconductor region of single-crystal silicon or the like by using technology similar to semiconductor integrated circuit fabrication technology.

The unit pixels 3 are connected to the vertical scanning circuit 14 via vertical control lines 15 for vertical column selection and to the CDS processing unit 26 via vertical signal lines 19.

The horizontal scanning circuit 12 and the vertical scanning circuit 14 are formed by a shift register, for example, and start shift operation (scanning) in response to a driving pulse supplied from the timing generator 20. The vertical control lines 15 therefore include various pulse signals for driving the unit pixels 3. As will be described later, each pulse signal is provided freely in any of a row direction and a column direction with respect to the unit pixels 3 (a pulse signal wiring method is free).

The CDS processing unit 26 is provided for each column. The CDS processing unit 26 subjects a pixel signal in a voltage mode inputted via a vertical signal line 19 to processing for obtaining a difference between a signal level immediately after pixel reset (noise level) and a signal level on the basis of two sample pulses such as a sample pulse SHP and a sample pulse SHD supplied from the timing generator 20. The CDS processing unit 26 thereby removes noise signal components referred to as fixed pattern noise (FPN) and reset noise. Incidentally, an AGC (Auto Gain Control) circuit, an ADC (Analog-Digital Converter) circuit and the like can be provided in a stage succeeding the CDS processing unit 26 as required.

The voltage signal processed by the CDS processing unit 26 is transmitted to a horizontal signal line 18, thereafter inputted to an output buffer 24 via a horizontal selection switch not shown in the figure driven by a horizontal selection signal from the horizontal scanning circuit 12, and then supplied to an external circuit not shown in the figure as an image pickup signal.

That is, an output signal (voltage signal) from a unit pixel 3 in the column type solid-state image pickup device 1 is outputted to a vertical signal line 19, the CDS processing unit 26, the horizontal signal line 18, and the output buffer 24 in that order. The driving is performed such that pixel output signals for one row are supplied to the CDS processing unit 26 in parallel via the vertical signal lines 19 and signals after the CDS processing are outputted serially via the horizontal signal line 18. The vertical control lines 15 control selection of each row.

Figure 2A:
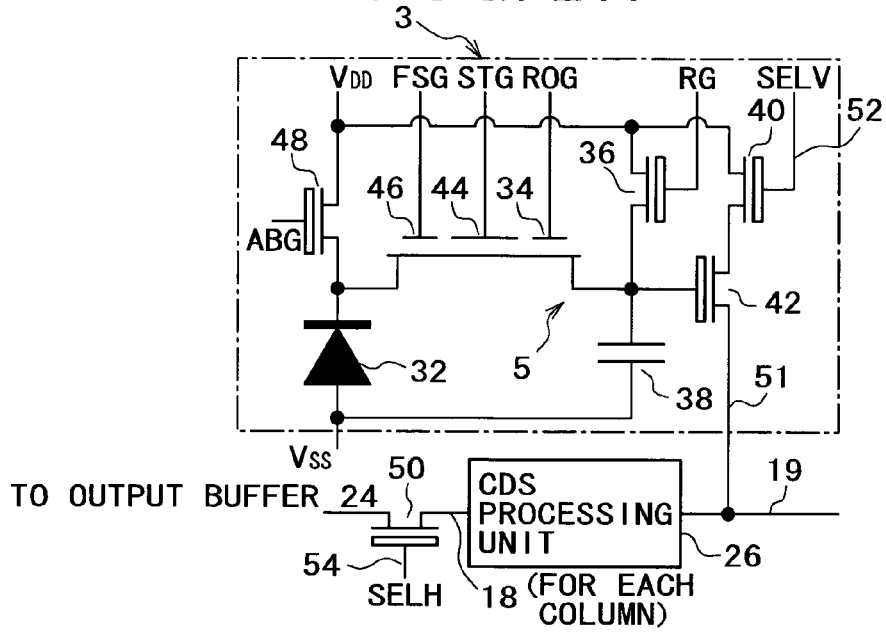
FIGS. 2A, 2B, and 2C are diagrams showing a detailed example of a first embodiment of a unit pixel in an image pickup unit of the solid-state image pickup device shown in FIG. 1.
Figure 2B:
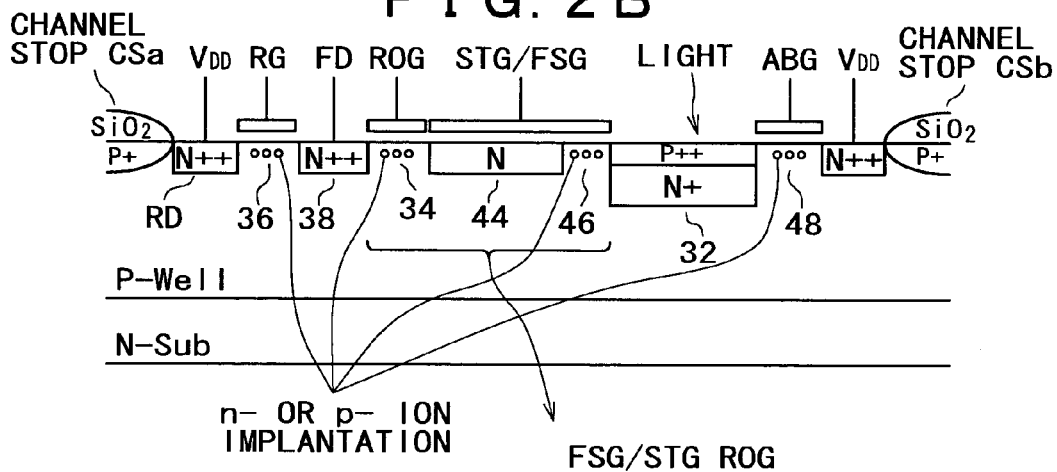
Figure 2C:
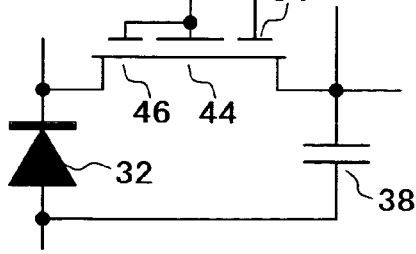

FIGS. 2A, 2B, and 2C are diagrams showing a detailed example of a first embodiment of a unit pixel 3 in the image pickup unit 10 of the solid-state image pickup device 1 shown in FIG. 1. FIG. 2A is a diagram of a fundamental equivalent circuit of the unit pixel 3 (partly including a peripheral section); FIG. 2B is a sectional view of the unit pixel 3; and FIG. 2C is a diagram of an equivalent circuit obtained by partially modifying the unit pixel 3.

As shown in FIG. 2A, the unit pixel 3 according to the first embodiment includes: a charge generating section 32 having both a function of photoelectric conversion for converting light into charge and a charge accumulating function for accumulating the charge; and four MOS transistors, that is, a reading selection transistor 34 as an example of a charge reading section (readout gate section) for the charge generating section 32, a reset transistor 36 as an example of a reset gate section, a vertical selection transistor 40, and an amplifying transistor 42 of a source follower configuration as an example of a detecting element for detecting change in potential of a floating diffusion 38.

The unit pixel 3 also includes a pixel signal generating section 5 of an FDA (Floating Diffusion Amp) configuration including the floating diffusion 38 as an example of a charge injection section having a function of a charge storage section.

A cathode of a photodiode PD forming the charge generating section 32 is connected with a source of a transfer gate section 46. The reading selection transistor 34 has a drain connected to the floating diffusion 38 as the storage section.

As shown in the sectional view of FIG. 2B, in the unit pixel 3, for example a p-type well (P-Well) as a p-type layer forming an overflow barrier is formed on a semiconductor substrate NSUB (n-type Si substrate) made of silicon. An n-type layer (N+) is formed on the p-type well to construct the charge generating section 32 formed by the photodiode PD having a pn junction.

Incidentally, though omitted in FIG. 2B, a final structure of the unit pixel 3 for example has an opening over the charge generating section 32 and a light shield film covering a portion other than the opening to thereby block incidence of extraneous light on a portion other than the charge generating section 32. A color filter, a microlens and the like are formed over the charge generating section 32 in an on-chip manner.

The photodiode PD forming the charge generating section 32 is of a structure such that a p-type high-concentration (p++) layer for pinning an Si interface so as to suppress the flowing out of charge (dark current) caused by an interface state is additionally formed as a hole storing layer on a substrate surface side of the photosensitive region. The charge generating section 32 performs photoelectric conversion to convert incident light into a signal charge whose charge amount corresponds to a light amount of the incident light, and stores the signal charge in the n-type layer (N+).

On the left side of the photodiode PD in FIG. 2B, the reading selection transistor 34, an N++ layer forming the floating diffusion 38, the reset transistor 36, an N++ layer connected to a power supply VDD and forming a reset drain RD, and a P+ layer and an SiO2 layer forming a channel stop CSa are formed in that order in a horizontal direction (direction of the left of the figure).

A transfer electrode (gate electrode) formed for example by polysilicon with a single-layer or double-layer structure is disposed on the substrate surface side of the reading selection transistor 34 and the reset transistor 36. A readout pulse is inputted to the gate electrode (specifically referred to as a readout gate ROG) of the reading selection transistor 34, and a reset pulse is inputted to the gate electrode (specifically referred to as a reset gate RG) of the reset transistor 36.

In order to realize a global shutter function, or an electronic shutter function without an accumulation time difference, each of the unit pixels 3 according to the first embodiment has a charge storage section 44 and a transfer gate section 46 for simultaneously transferring, to the charge storage section 44, a signal charge generated by the charge generating section 32 (photodiode PD) after the charge generating section 32 is exposed to light between the reading selection transistor 34 of the charge generating section 32 and the pixel signal generating section 5. The charge storage section 44 stores charge for a period not less than one H (H: horizontal scanning period).

For example, as shown in the sectional view of the unit pixel 3 of FIG. 2B, the transfer gate section 46 and the charge storage section 44 are formed in that order in the horizontal direction (direction of the left of the figure) between the photodiode PD and the reading selection transistor 34. The reading selection transistor 34, the charge storage section 44, and the transfer gate section 46 are of a multi-gate structure having common source and drain terminals. The charge storage section 44 disposed at the center of the three sections is effectively formed as a MOS diode having a gate.

A transfer electrode (gate electrode) formed for example by polysilicon with a single-layer or double-layer structure is disposed on the substrate surface side of the transfer gate section 46 and the charge storage section 44. A frame shift pulse is inputted to the gate electrode (specifically referred to as a frame shift gate FSG) of the transfer gate section 46, and a storage pulse is inputted to the gate electrode (specifically referred to as a storage gate STG) of the charge storage section 44.

In a device structure of the unit pixel 3 according to the first embodiment shown in FIG. 2B, the charge storage section 44 is a MOS diode having a gate, and a portion for storing a charge is formed under the gate electrode of the charge storage section 44.

In this case, a single-gate structure is used in which the transfer gate section 46 disposed between the photodiode PD and the charge storage section 44 and the charge storage section 44 have a common gate electrode, and the gate electrode is formed so as to extend to an edge of the charge generating section 32. Of course, the frame shift pulse and the storage pulse are used commonly in this case.

The function of the transfer gate section 46 of this structure is desirably performed by providing a difference in impurity concentration between the transfer gate section 46 and the charge storage section 44 by n− or p− ion implantation or by providing a barrier (potential difference) by providing a difference in oxide film thickness between the transfer gate section 46 and the charge storage section 44, or the like.

Incidentally, as shown in FIG. 2B, n− or p− ion implantation is performed in the parts of the reading selection transistor 34 and the reset transistor 36.

FIG. 2C shows a diagram of an equivalent circuit of the charge storage section 44 and the transfer gate section 46 and the vicinity thereof in the case of the single-gate structure. The charge storage section 44 and the transfer gate section 46 are not limited to the single-gate structure, and may be of a two-gate structure in which the gates of the charge storage section 44 and the transfer gate section 46 are provided separately. However, the two-gate structure has a part where it is difficult to transfer signal charge from the charge generating section 32 to the charge storage section 44 because of a problem of displacement between fabrication positions of the two gate electrodes and a gap between the electrodes.

On the other hand, the single-gate structure makes it possible to reduce wiring to the unit pixel 3 by one wire and reduce gates and wiring contacts (see FIG. 2C). In addition, the ability to control the potential difference through control of an amount of ion implantation or the difference in oxide film thickness increases fabrication accuracy of the elements. Furthermore, no gap between the gate electrodes results in an enhanced efficiency of transfer of signal charge from the charge generating section 32 to the charge storage section 44.

Regardless of whether the charge storage section 44 and the transfer gate section 46 are of the single-gate structure or the two-gate structure, the transfer gate section 46 disposed between the photodiode PD of the charge generating section 32 and the charge storage section 44 is made to be able to form a state of storing charge of an opposite conduction type from signal charge at a channel surface in an off state. The same applies to the reading selection transistor 34 and the reset transistor 36. Incidentally, voltage applied to the gate electrodes at an off time to form such a state depends on ion concentration (dose) of impurities of the elements or film thickness of the gate electrodes.

When the transistor is turned off by applying a predetermined potential to form the inverted state at the surface of a channel region under the gate electrode, the interface state is filled with holes (which is referred to as pinning). Thus, dark current caused by the interface state can be suppressed by applying a predetermined potential to the transfer gate section 46, the reading selection transistor 34, and the reset transistor 36 as a charge transfer path at the off time.

As shown in FIG. 2A, the unit pixel 3 according to the first embodiment further includes a control switch 48 as an example of an unnecessary charge discharging gate section switchable to block a flow of unnecessary charge that does not contribute to image formation and is generated in the charge generating section 32, according to a potential (height of an electric barrier). A MOS transistor PDS, for example, is used as the control switch 48. In the first embodiment, the power supply VDD performs the function of an anti-blooming drain ABD disposed on an opposite side of the control switch 48 from the charge generating section 32 for receiving unnecessary charge swept out of the charge generating section 32 through the control switch 48.

Specifically, the MOS transistor PDS forming the control switch 48 has a source connected to the cathode of the photodiode PD forming the charge generating section 32 and a drain connected to the power supply VDD. This structure is similar to a horizontal type or vertical type overflow control of a CCD type solid-state image pickup device. In the first embodiment, the anti-blooming drain (overflow drain) ABD is used as the power supply VDD itself.

A gate electrode (specifically referred to as an anti-blooming gate ABG) of the MOS transistor PDS is fed with a pulse signal (specifically referred to as an anti-blooming pulse) for turning on/off the MOS transistor PDS.

For example, as shown in the sectional view of the unit pixel 3 of FIG. 2B, the MOS transistor PDS as the control switch 48, an N++ layer connected to the power supply VDD and forming the anti-blooming drain ABD, and a P+ layer and an SiO2 layer forming a channel stop CSb are formed in that order in a horizontal direction (direction of the right of the figure) on the right side of the photodiode PD in FIG. 2B. The channel stop CSb represents a channel stop CSa of another unit pixel 3 adjacent to the unit pixel 3.

As shown in FIG. 2B, n− or p− ion implantation is performed in the part of the MOS transistor PDS for the control switch 48. Thus, the control switch 48 can be made to form a state of storing charge (opposite charge) of the opposite conduction type from signal charge at a channel surface by bringing the control switch 48 into an off state with a predetermined voltage. Incidentally, voltage applied to the gate electrode at an off time to form such a state depends on ion concentration (dose) of an impurity of the element or film thickness of the gate.

When the control switch 48 is turned off by thus applying a predetermined potential to form the inverted state at the surface of a channel region under the gate electrode, the interface state is filled with holes (pinning). Thus, dark current caused by the interface state at the off time can be suppressed in the control switch 48 as a charge transfer path.

The reset transistor 36 in the pixel signal generating section 5 has a source connected to the floating diffusion 38, a drain connected to the power supply VDD, and a gate (reset gate RG) supplied with a reset pulse. The reset transistor 36 is of a depletion type to reset the floating diffusion 38 to the potential of the power supply VDD.

The vertical selection transistor 40 has a drain connected to the power supply VDD, a source connected to a drain of the amplifying transistor 42, and a gate (specifically referred to as a vertical selection gate SELV) connected to a vertical selection line 52. The vertical selection signal is applied to the vertical selection line 52.

The amplifying transistor 42 has a gate connected to the floating diffusion 38, a drain connected to the source of the vertical selection transistor 40, and a source connected to a pixel line 51.

The pixel line 51 of each unit pixel 3 is connected to the vertical signal line 19 shared with pixel lines 51 of other unit pixels 3, and connected to a unit for a corresponding column of the CDS processing unit 26 provided for each column. A horizontal selection transistor 50 supplied with a horizontal selection signal from the horizontal scanning circuit 12 not shown in the figure is connected in a stage succeeding the CDS processing unit 26.

The frame shift pulse inputted to the frame shift gate FSG, the storage pulse inputted to the storage gate STG, the readout pulse inputted to the readout gate ROG, the reset pulse inputted to the reset gate RG, the vertical selection signal inputted to the vertical selection gate SELV, the horizontal selection signal inputted to a horizontal selection gate SELH, and the anti-blooming pulse inputted to the anti-blooming gate ABG are supplied through wiring in a horizontal direction and/or a vertical direction with respect to the unit pixel 3.

In this configuration, a signal charge generated as a result of light entering the photodiode PD of the charge generating section 32 is transferred to the charge storage section 44 via the transfer gate section 46 simultaneously in all the pixels and temporarily stored in the charge storage section 44. The signal charge is then transferred to the floating diffusion 38 via the reading selection transistor 34 in predetermined readout timing. That is, the signal charge generated and accumulated by photoelectric conversion in the photodiode PD is injected (read out) into the floating diffusion 38 via the reading selection transistor 34.

When the readout pulse disappears, the reading selection transistor 34 is turned to an off state. In the unit pixel 3 in which the vertical selection transistor 40 is in an on state, the signal charge outputted to the floating diffusion 38 is amplified by the amplifying transistor 42 according to a charge amount of the signal charge and thereby converted into a signal voltage. The signal voltage is transmitted to the CDS processing unit 26 via the pixel line 51 and the vertical signal line 19, and then outputted to the horizontal signal line 18 via the CDS processing unit 26.

When the reset transistor 36 electrically conducts, a charge that has been retained in the floating diffusion 38 flows out to the power supply VDD via the reset transistor 36. A potential of the floating diffusion 38 is consequently restored to an initial level.

Also, in this configuration, a charge accumulated in the charge generating section 32 as a result of light entering the photodiode PD after the transfer of the signal charge to the charge storage section 44 is discharged prior to a next exposure accumulation. Thereby, a pixel signal corresponding to the amount of signal charge stored in the charge storage section 44 is obtained from the amplifying transistor 42, and the global electronic shutter function without a difference in exposure accumulation time can be realized by adjusting timing of transfer to the charge storage section 44 after exposure.

Further, in this configuration, the MOS transistor PDS forming the control switch 48 and the transfer gate section 46 are turned off during an exposure accumulation period during which the photodiode PD of the charge generating section 32 is exposed to light and accumulates signal charge therein. As for electric barriers on the periphery of the photodiode PD during the exposure accumulation period, it suffices for the electric barrier of the transfer gate section 46 to be shallower than that of a gate section formed by the control switch 48.

That is, as for the electric barriers that represent a factor defining an amount of saturation charge accumulated in the charge generating section 32 during the exposure accumulation period, the electric barrier of the transfer gate section 46 takes precedence over that of the gate section formed by the control switch 48. In other words, at least the amount of saturation charge in the charge generating section 32 is determined by a phenomenon of blooming of charge into the charge storage section 44 during the exposure accumulation period rather than the gate section alone formed by the control switch 48.

The MOS transistor PDS of the control switch 48 is turned on after the signal charge obtained in the charge generating section 32 is transferred to the charge storage section 44 simultaneously in all the pixels. At this time, it suffices for the electric barrier of the anti-blooming gate ABG (unnecessary charge discharging gate section) formed by the control switch 48 (MOS transistor PDS) to be shallower than that of the transfer gate section 46.

When light enters the photodiode PD of the charge generating section 32 after the signal charge is transferred to the charge storage section 44 simultaneously in all the pixels, and when the photodiode PD generates a charge more than an amount of charge that can be stored therein according to voltage potential distribution at that time, the charge overflows the photodiode PD. That is, a phenomenon similar to the "blooming phenomenon" (quasi-blooming phenomenon) occurs during a period other than the period of exposure accumulation of signal charge. The charge (excessive charge) overflowing the photodiode PD due to the quasi-blooming phenomenon is an unnecessary charge that does not contribute to image formation, and enters various parts around the photodiode PD.

However, the arrangement described above sweeps out the unnecessary charge to the power supply VDD as the anti-blooming drain ABD via the control switch 48 having a shallow electric barrier, so that the unnecessary charge does not overflow into the charge storage section 44 side. That is, it is possible to prevent the quasi-blooming phenomenon even when light enters the photodiode PD during the period other than the period of exposure accumulation of signal charge.

As described above, as for the electric barriers for preventing the quasi-blooming phenomenon, it suffices for the electric barrier of the unnecessary charge discharging gate section formed by the control switch 48 to take precedence over that of the transfer gate section 46. That is, the electric barriers at such levels as to prevent the overflow of the excessive charge from the charge generating section 32 into the charge storage section 44 side suffices for the period of exposure accumulation of signal charge during which the charge generating section 32 (photodiode PD) generates and accumulates signal charge. This represents a difference from overflow drain structure used in a CCD type solid-state image pickup device.

An operation for preventing blooming in the CMOS image pickup device according to the first embodiment having the above configuration will next be described in detail.

FIG. 3 is an example of a timing chart of scanning in the solid-state image pickup device 1 having the unit pixel 3 according to the first embodiment. In the first embodiment, the frame shift pulse inputted to the frame shift gate FSG and the storage pulse inputted to the storage gate STG are used commonly.

First, before the photodiode PD of the charge generating section 32 is exposed to light to accumulate a signal charge in the photodiode PD, the anti-blooming pulse is inactivated (L; low) to turn off the control switch 48 and the frame shift pulse is activated (H; high) to turn on the transfer gate section 46, whereby an undesired charge (unnecessary charge) accumulated in the photodiode PD at this point in time is swept out to the charge storage section 44 side (t0 to t2).

Thereafter closing the transfer gate section 46 as a gate function part between the photodiode PD and the charge storage section 44, exposure accumulation is started. These operations are performed substantially simultaneously in all the pixels. Incidentally, at this point in time, the anti-blooming pulse may remain activated. That is, the control switch 48 is turned off before (immediately before or close to) a start of exposure accumulation.

Then, the anti-blooming pulse is inactivated to turn off the control switch 48 and the frame shift pulse is also inactivated to start an operation for accumulating a signal charge generated by exposing the photodiode PD to light in the photodiode PD (t2). Then a state of exposure accumulation of the signal charge while the anti-blooming pulse remains inactivated is continued until t12.

In parallel with the state of exposure accumulation, the readout pulse is activated to turn on the reading selection transistor 34, whereby the unnecessary charge swept out to the charge storage section 44 is transferred to the floating diffusion 38. Then the reading selection transistor 34 is turned off, and the reset pulse is activated to turn on the reset transistor 36, whereby the floating diffusion 38 is reset to the potential of the power supply VDD through the reset transistor 36. Thereby, the unnecessary charge transferred from the charge generating section 32 to the floating diffusion 38 via the transfer gate section 46, the charge storage section 44, and the reading selection transistor 34 in that order is swept out to the power supply VDD.

It suffices to complete these operations before completion of accumulation of the signal charge. While in FIG. 3, the readout pulse is activated in a period of t2 to t4 and the reset pulse is activated in a period of t4 to t6, the operations are not limited to this example, and may be performed at positions somewhat shifted to the right side in the figure.

Next, before transferring the signal charge obtained in the charge generating section 32 to the charge storage section 44 simultaneously in all the pixels (frame shift), the charge storage section 44 is cleared. Hence, before activating the frame shift pulse at the time of completion of the exposure accumulation, the readout pulse is activated to turn on the reading selection transistor 34, whereby an unnecessary charge stored in the charge storage section 44 is transferred to the floating diffusion 38 (t8 to t10).

Then, the reading selection transistor 34 is turned off, and the reset pulse is activated to turn on the reset transistor 36, whereby the floating diffusion 38 is reset to the potential of the power supply VDD through the reset transistor 36. Thereby, the unnecessary charge transferred from the charge storage section 44 to the floating diffusion 38 is swept out to the power supply VDD (t10 to t12). Incidentally, the above-mentioned operations of t2 to t4 and t4 to t6 may be omitted so that the operations of t8 to t10 and t10 to t12 also serve as the operations of t2 to t4 and t4 to t6.

Next, in order to transfer the signal charge obtained in the charge generating section 32 to the charge storage section 44 simultaneously in all the pixels, the frame shift pulse is activated to thereby transfer the signal charge generated by exposing the photodiode PD to light to the charge storage section 44 substantially simultaneously in all the pixels while the anti-blooming pulse is inactivated to maintain an off state of the control switch 48 (t10 to t12). Thereafter the anti-blooming pulse is activated to turn on the control switch 48 substantially simultaneously in all the pixels (t12).

Incidentally, it suffices to turn on the control switch 48 at least after a start of transfer of the signal charge to the charge storage section 44. For example, the anti-blooming pulse may be activated after completion of the charge transfer from the charge generating section 32 (photodiode PD) to the charge storage section 44, that is, a little after t12 in FIG. 3 (to the right side of the figure). Alternatively, the anti-blooming pulse may be activated a little after the frame shift pulse is activated during the transfer, that is, during the period of t10 to t12 in FIG. 3.

Next, at a predetermined time after the signal charge is transferred from the charge generating section 32 to the charge storage section 44, the pixel signal generating section 5 reads the signal charge from the charge storage section 44 (line shift), and obtains a pixel signal. For this, first the horizontal selection signal for a pixel to be read at a predetermined position in an arbitrary horizontal line is activated to thereby turn on the horizontal selection transistor 50 while the control switch 48 is maintained in an on state (t14).

Then the reset pulse is activated to turn on the reset transistor 36, whereby the floating diffusion 38 is reset to the potential of the power supply VDD through the reset transistor 36. Thereby the floating diffusion 38 is cleared (t16 to t18). Thus, a voltage corresponding to a reset level appears in the pixel line 51, and is then transmitted to the output buffer 24 via the vertical signal line 19, the CDS processing unit 26, and the horizontal selection transistor 50.

By activating the sample pulse SHP immediately thereafter, the CDS processing unit 26 retains a pixel signal level (reset level) at the time of clearing the floating diffusion 38 (t20 to t22). For example, the CDS processing unit 26 clamps a voltage value at that time to a predetermined voltage.

Next, the readout pulse is activated to turn on the reading selection transistor 34, whereby the signal charge stored in the charge storage section 44 is outputted to the floating diffusion 38 (t24 to t26). The readout pulse is then inactivated (t26). The signal charge of the pixel to be read, which signal charge has been outputted to the floating diffusion 38, is amplified by the amplifying transistor 42 according to a charge amount of the signal charge and thereby converted into a signal voltage. The signal voltage appears in the vertical signal line 19, and is then transmitted to the output buffer 24 via the CDS processing unit 26, the horizontal signal line 18, and the horizontal selection transistor 50.

By activating the sample pulse SHD immediately thereafter, the CDS processing unit 26 retains a pixel signal level corresponding to the amount of signal charge (t28 to t30) Thereafter the horizontal selection signal is inactivated (t32). The CDS processing unit 26 removes fixed pattern noise FPN and reset noise by obtaining a difference between the reset level obtained by the sample pulse SHP and the pixel signal level obtained by the sample pulse SHD.

The series of operations described above is repeated to sequentially output pixel signals from the image pickup unit 10 having the unit pixels 3 arranged in the form of a two-dimensional matrix, and finally image pickup signals are obtained from the CDS processing unit 26.

Figure 4A:
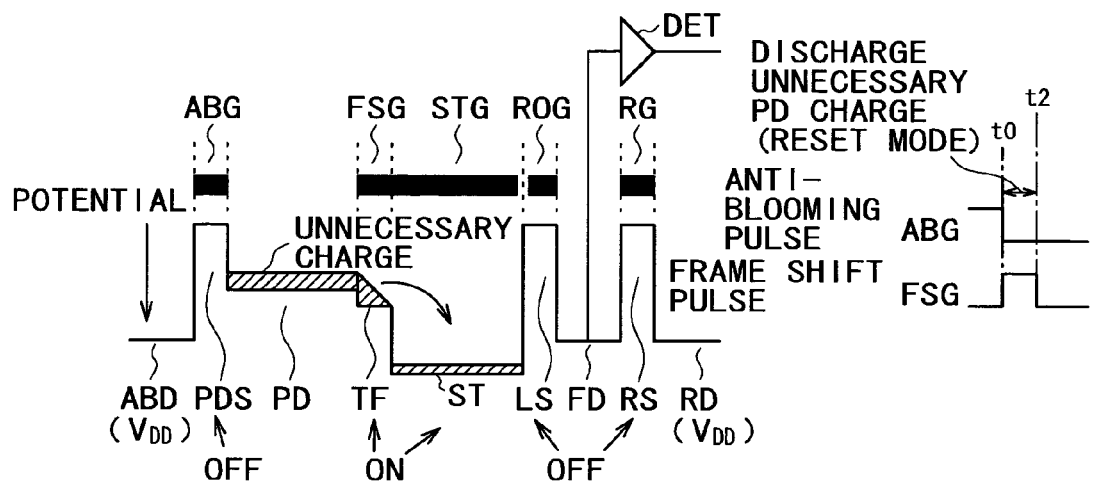
FIGS. 4A and 4B are diagrams of assistance in explaining details of states of operation during a period of t0 to t2 (reset mode) in the timing chart shown in FIG. 3.
Figure 4B:
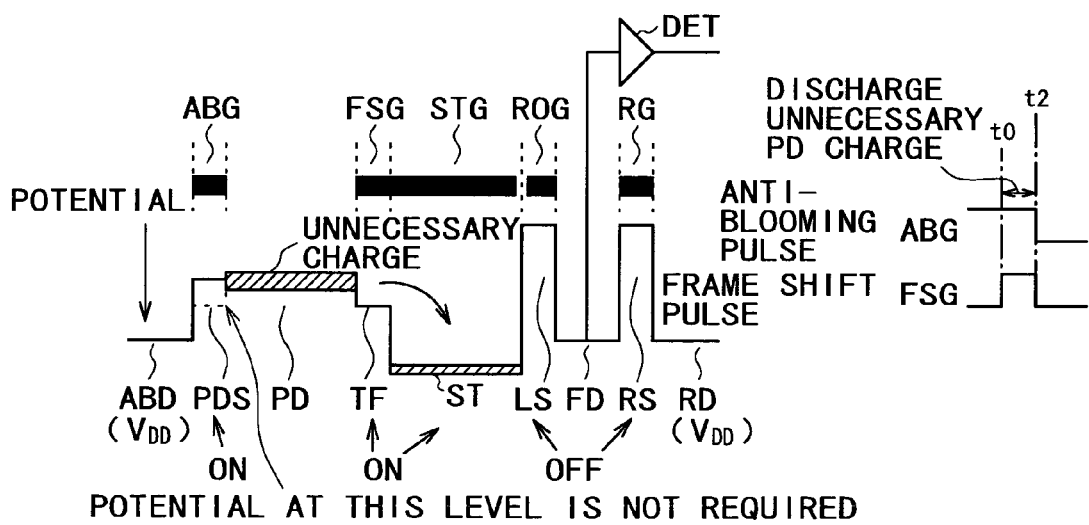

FIGS. 4A and 4B are diagrams of assistance in explaining details of states of operation during the period of t0 to t2 in the timing chart shown in FIG. 3. This period corresponds to a reset mode for discharging an unnecessary charge of the photodiode PD forming the charge generating section 32. In this reset mode, the MOS transistor PDS as an example of the control switch 48 that functions as the anti-blooming gate is in an off state, and the transfer gate section 46 functioning as the frame shift gate FSG is in an on state. Therefore the transfer gate section 46 side has a higher potential than the MOS transistor PDS side.

A voltage applied to the gate of the transfer gate section 46 is defined such that the voltage potential of the transfer gate section 46 when the transfer gate section 46 is turned on is higher than that of the photodiode PD. Since the frame shift pulse inputted to the transfer gate section 46 as the frame shift gate FSG and the storage pulse inputted to the storage gate STG are used commonly, a potential of the charge storage section 44 becomes even higher than that of the transfer gate section 46 with the turning on of the transfer gate section 46.

Thus, as shown in the potential diagram of FIG. 4A, the voltage potential of the unit pixel 3 forms a stepwise structure in the control switch 48, the photodiode PD, the transfer gate section 46, and the charge storage section 44 in such a manner as to increase in that order. The charge (unnecessary charge) accumulated in the photodiode PD therefore moves to the charge storage section 44 side having a shallower electric barrier. That is, at this time, the unnecessary charge accumulated in the photodiode PD is transferred to the charge storage section 44 functioning as a storage gate.

It is to be noted that in this mode, it suffices to turn off the control switch 48 before (immediately before or close to) a start of charge accumulation. The timing of turning off the control switch 48 is not limited to the above example; the transfer gate section 46 may be turned on while the anti-blooming pulse is activated and the control switch 48 remains turned on. In this case, while both the transfer gate section 46 and the control switch 48 with the photodiode PD interposed therebetween are in an on state, the control switch 48 side does not necessarily have a higher voltage potential than the photodiode PD, as shown in FIG. 4B (details will be described later).

Thus, a major part of the unnecessary charge of the photodiode PD is swept out to the charge storage section 44 side. However, when the amount of unnecessary charge is large, a part of the unnecessary charge can go over the barrier of the control switch 48 to be swept out to the power supply VDD functioning as the anti-blooming drain ABD. In other words, the control switch 48 at this time may be in an on state at a low potential.

FIGS. 5A, 5B, and 5C are diagrams of assistance in explaining details of states of operation during the period of t2 to t4 and the period of t4 to t6 in the timing chart shown in FIG. 3. These periods are post-processing periods for the reset mode. Incidentally, the operation during the period of t2 to t4 is the same as the operation during the period of t8 to t10, and the operation during the period of t4 to t6 is practically the same as the operation during the period of t10 to t12.

The period of t2 to t4 shown in FIG. 5A corresponds to a mode for discharging the unnecessary charge swept out to the charge storage section 44 to the floating diffusion 38 side. In this mode, the MOS transistor PDS as an example of the control switch 48 that functions as the anti-blooming gate and the transfer gate section 46 functioning as the frame shift gate FSG are in an off state, and the reading selection transistor 34 is in an on state.

Thus, as shown in the potential diagram of FIG. 5A, the voltage potential on the right side in the figure of the photodiode PD in the unit pixel 3 forms a stepwise structure in the transfer gate section 46, the charge storage section 44, and the reading selection transistor 34 in such a manner as to increase in that order. The unnecessary charge swept out to the charge storage section 44 is further transferred to the floating diffusion 38 side having a shallower electric barrier.

The period of t4 to t6 shown in FIG. 5B corresponds to a mode for discharging the unnecessary charge swept out to the floating diffusion FD to the power supply VDD functioning as the reset drain RD. In this mode, the reading selection transistor 34 is turned off, and the reset pulse is activated to turn on the reset transistor 36, whereby the floating diffusion 38 is reset to the potential of the power supply VDD through the reset transistor 36. Thereby, the unnecessary charge transferred from the charge storage section 44 to the floating diffusion 38 is swept out to the power supply VDD. It is thus possible to discharge unnecessary charge entering the charge storage section 44 and the like due to the quasi-blooming phenomenon during a period other than a period of charge accumulation and dark current generated within the charge storage section 44, and hence suppress degradation in picture quality attendant on the quasi-blooming phenomenon and dark current.

As is understood from FIGS. 5A and 5B, during the period of t2 to t6, both the transfer gate section 46 and the control switch 48 with the photodiode PD interposed therebetween are in the off state, so that the periphery of the photodiode PD has a low potential and the photodiode PD has a high potential, thus forming a charge well with the photodiode PD at the center.

Thus, a signal charge generated by exposing the photodiode PD to light is accumulated in the photodiode PD itself, and the signal charge of the photodiode PD is separated from the detecting section 5. This exposure accumulation operation is not affected by the operation of the reading selection transistor 34 and the reset transistor 36. Hence, it suffices to finish the process of sweeping out the unnecessary charge to the floating diffusion 38 and the power supply VDD before completion of the exposure accumulation operation.

The same operation as in the period of t2 to t4 is performed in the period of t8 to t10 (see FIG. 5A). The operation in the period of t10 to t12, during which the transfer gate section 46 is turned on as shown in FIG. 5C, is different from the operation in the period of t4 to t6 in that the signal charge accumulated in the charge generating section 32 is transferred to the charge storage section 44 (see FIG. 5B). However, the floating diffusion 38 side is in the same state as in the period of t4 to t6.

Thus, the unnecessary charge such as excessive charge attendant on exposure to excessive light to be described with reference to FIGS. 6A, 6B, and 6C and charge attendant on dark current is swept out to the power supply VDD as the reset drain RD via the floating diffusion 38, whereby the charge storage section 44 and the floating diffusion 38 are reset. It is thereby possible to discharge unnecessary charge flowing into the charge storage section 44 due to the blooming phenomenon during the period of charge accumulation, and to thus reduce degradation in picture quality attendant on the blooming phenomenon.

Figure 6A:
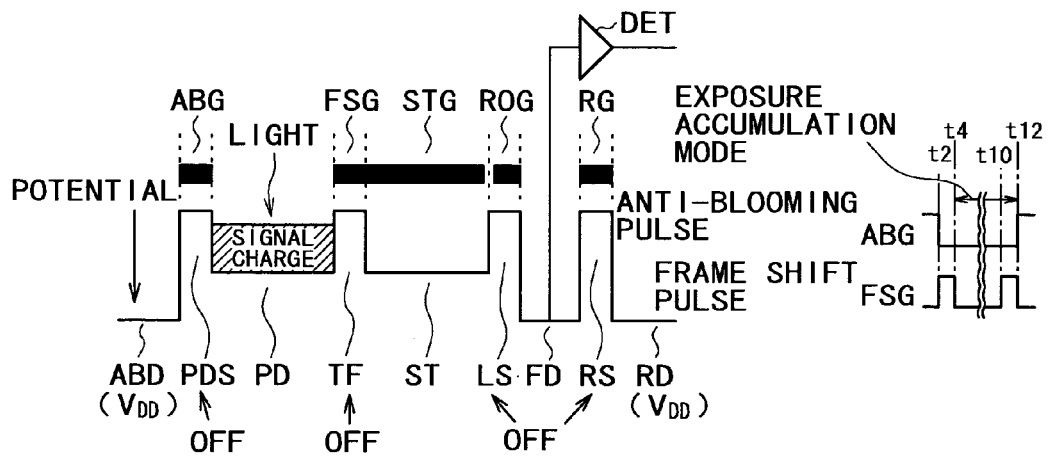
FIGS. 6A, 6B, and 6C are diagrams of assistance in explaining details of states of operation during a period of t2 to t12 (exposure accumulation mode) in the timing chart shown in FIG. 3.
Figure 6B:
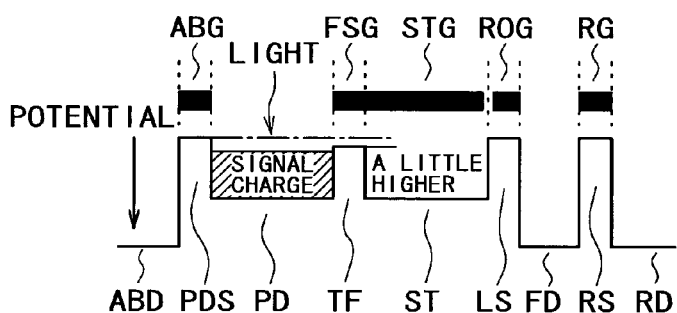
Figure 6C:
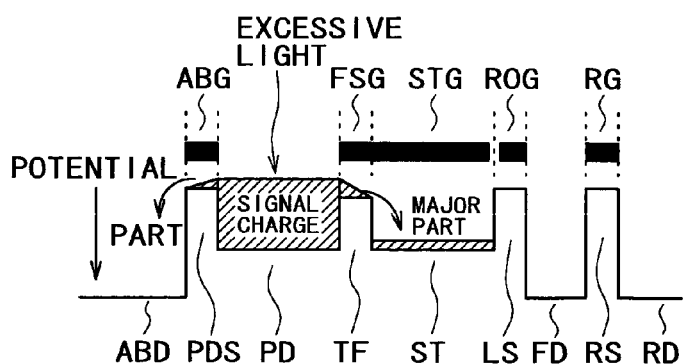

FIGS. 6A, 6B, and 6C are diagrams of assistance in explaining details of states of operation during the period of t2 to t12 in the timing chart shown in FIG. 3. This period corresponds to an exposure accumulation mode for accumulating the signal charge generated by exposing the photodiode PD to light in the photodiode PD itself. It is to be noted that in the period of t10 to t12, the transfer gate section 46 is turned on to immediately transfer the signal charge accumulated in the photodiode PD to the charge storage section 44.

In this exposure accumulation mode, for the most part (excluding the period of t10 to t12, for example), both the transfer gate section 46 and the control switch 48 with the photodiode PD interposed therebetween are in the off state, so that the periphery of the photodiode PD has a low potential and the photodiode PD has a high potential, as shown in FIG. 6A. Therefore the electric barriers of both the transfer gate section 46 and the control switch 48 are high (deep) for the signal charge generated in the photodiode PD, thus forming a charge well with the photodiode PD at the center.

From a viewpoint of efficiency of transfer of the signal charge to the charge storage section 44 at the time of the frame shift (t10 to t12), a voltage applied to the gate electrode of the transfer gate section 46 is defined such that the voltage potential of the transfer gate section 46 when the transfer gate section 46 is turned on is higher than that of the photodiode PD (see the description with reference to FIGS. 4A and 4B).

When the voltage applied to the gate electrode of the transfer gate section 46 is thus defined, on the other hand, since there is a limit to a voltage dynamic range for on-off control, the voltage potential of the transfer gate section 46 when the transfer gate section 46 is turned off practically tends to be higher than that of the control switch 48 in an off state, as shown in FIG. 6B. In other words, the frame shift gate FSG is not completely closed even when the transfer gate section 46 is turned off, whereas the anti-blooming gate ABG can be fully closed when the control switch 48 is turned off.

Thus, as to the electric barriers for the signal charge accumulated in the photodiode PD in the exposure accumulation mode, the electric barrier of the transfer gate section 46 (frame shift gate FSG) is shallower than that of the gate section (anti-blooming gate ABG) formed by the control switch 48.

In the exposure accumulation mode under such conditions, the photodiode PD as the charge generating section 32 generates signal charge corresponding to an amount of light exposure, and gradually accumulates the signal charge therein. When intense light enters the photodiode PD, as shown in FIG. 6C, a charge more than a maximum amount of charge that can be accumulated in the photodiode PD is generated, and the charge overflows the photodiode PD.

At this time, since as described with reference to FIG. 6B, the voltage potential of the transfer gate section 46 (frame shift gate FSG) when the transfer gate section 46 is turned off tends to be higher than that of the control switch 48 (anti-blooming gate ABG) in an off state, and as to the electric barriers for the signal charge accumulated in the photodiode PD, the electric barrier of the frame shift gate FSG is shallower than that of the anti-blooming gate ABG, the excess charge generated at the time of the excessive light exposure flows out to the charge storage section 44 through the transfer gate section 46 in the off state (a blooming state practically occurs).

That is, as to the electric barriers that represent a factor defining an amount of saturation charge accumulated in the photodiode PD as the charge generating section 32, the electric barrier of the transfer gate section 46 (frame shift gate FSG) takes precedence over that of the gate section formed by the control switch 48. In other words, unlike overflow drain structure used in a CCD type solid-state image pickup device, at least the amount of saturation charge in the charge generating section 32 is determined by blooming of charge into the charge storage section 44 rather than the anti-blooming gate ABG alone formed by the control switch 48.

Incidentally, as described with reference to FIGS. 5A, 5B, and 5C, the excess charge that has flowed into the charge storage section 44 is swept out to the power supply VDD as the reset drain RD via the floating diffusion 38 in the period of t8 to t12. The excess charge therefore does not appear as an image.

Because of a small difference in potential between the transfer gate section 46 and the control switch 48, in a case of a very large amount of excess charge and a case where the control switch 48 is not completely turned off, a part of the excess charge can go over the barrier of the control switch 48 to be swept out also to the power supply VDD functioning as the anti-blooming drain ABD.

Even in this case, a major part of the excess charge goes over the barrier of the transfer gate section 46 to be swept out to the charge storage section 44. That is, a sum of amounts of blooming is determined by a combination of an amount of blooming into the charge storage section 44 via the frame shift gate FSG (transfer gate section 46) and an amount of blooming into the anti-blooming drain ABD via the anti-blooming gate ABG (control switch 48). Still, the amount of accumulated saturation charge (maximum amount of signal charge that can be accumulated in the photodiode PD) is defined preferentially by the transfer gate section 46 rather than the control switch 48.

As is understood from the above description, in the first embodiment, the amount of accumulated saturation charge is not defined preferentially by the control switch 48 rather than the transfer gate section 46. That is, in the exposure accumulation mode, it suffices for the anti-blooming gate ABG to have a slightly higher potential barrier than the frame shift gate FSG. When the anti-blooming gate ABG is provided, the saturation amount tends to be defined by the ABG potential, but it is not needed with the configuration of the first embodiment.

This means that unlike overflow control in a CCD solid-state image pickup device, the amount of saturation charge of the photodiode PD does not need to be determined accurately by the control switch 48. Hence, a transistor whose voltage potential is roughly determined suffices for the MOS transistor PDS forming the control switch 48, and thus a transistor with a narrow channel width W suffices.

Figure 7A:
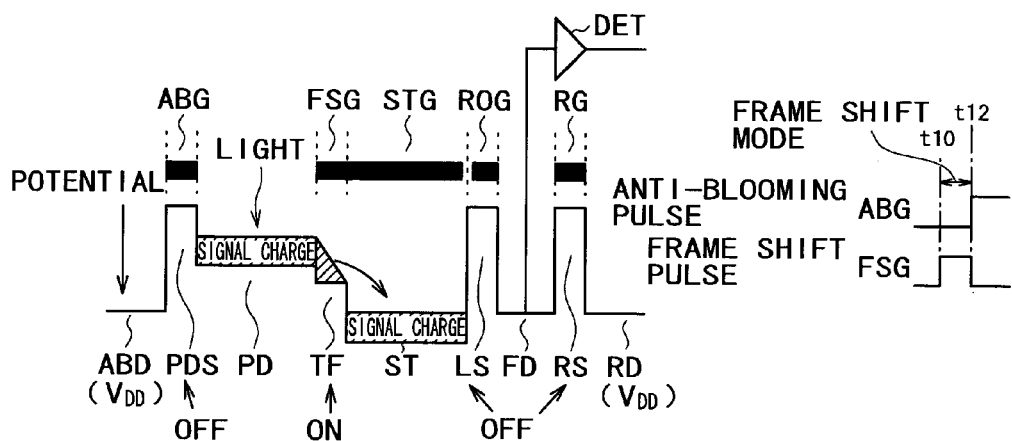
FIGS. 7A, 7B, 7C, and 7D are diagrams of assistance in explaining details of states of operation during a period of t10 to t12 (frame shift mode) in the timing chart shown in FIG. 3.

FIGS. 7A, 7B, 7C, and 7D are diagrams of assistance in explaining details of states of operation during the period of t10 to t12 in the timing chart shown in FIG. 3. FIG. 7A shows an example in which timing of the turning on of the control switch 48 coincides with timing of completion of a frame shift (timing of turning off of the frame shift pulse after turning on the frame shift pulse).

This period corresponds to a frame shift mode (charge transfer mode) for transferring the signal charge accumulated by exposure in the charge generating section 32 to the charge storage section 44 simultaneously in all the pixels. In this mode, as in the reset mode represented in FIG. 4A, the MOS transistor PDS as the control switch 48 is in an off state, and the transfer gate section 46 is in an on state. Further, the voltage potential of the transfer gate section 46 when the transfer gate section 46 is turned on is higher than that of the photodiode PD. Thus, as shown in the potential diagram of FIG. 7A, the voltage potential of the unit pixel 3 forms a stepwise structure in the control switch 48, the photodiode PD, the transfer gate section 46, and the charge storage section 44 in such a manner as to increase in that order. The signal charge accumulated by exposure in the photodiode PD is transferred to the charge storage section 44 side having a shallower electric barrier.

It is to be noted that the timing of the turning on of the control switch 48 does not necessarily need to coincide with the timing of completion of a frame shift. It suffices to turn on the control switch 48 at least after the turning on of the transfer gate section 46, that is, a start of transfer of the signal charge to the charge storage section 44.

Figure 7B:
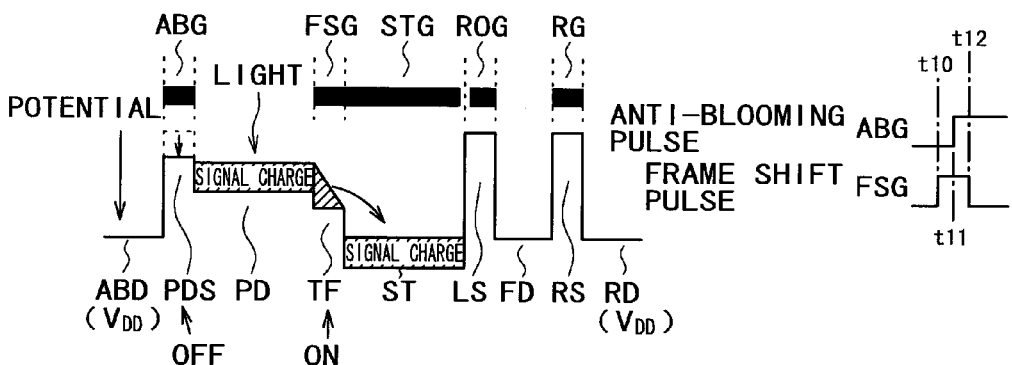

For example, the control switch 48 is desirably turned on after the signal charge is transferred to the charge storage section 44 sufficiently so that the charge in the photodiode PD does not go over the control switch 48 to flow to the power supply VDD as the anti-blooming drain. For example, as shown in FIG. 7B, the control switch 48 may be turned on in the middle of transfer of the signal charge from the photodiode PD to the charge storage section 44 (t11). At the time t11, as shown in FIG. 7B, it suffices to set the voltage potential of the control switch 48 when the control switch 48 is turned on to a level such that the signal charge of the photodiode PD at that time does not go over the control switch 48.

In a case where the photodiode PD is exposed to excessive light, as shown in FIG. 6C, the excess charge is swept out over the control switch 48 to the power supply VDD as the anti-blooming drain in the exposure accumulation mode. In such a case, as shown in FIG. 7C, the signal charge generated in the photodiode PD may be swept out over the control switch 48 to the power supply VDD as the anti-blooming drain when the control switch 48 is turned on at the time t11.

Figures 7C, 7D:
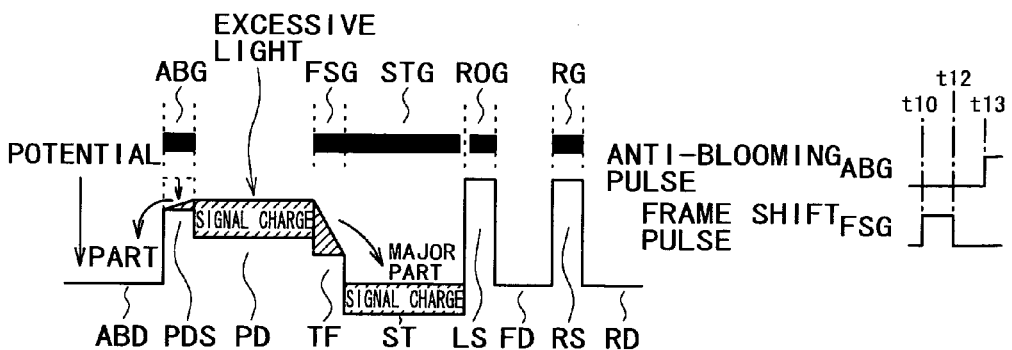

Alternatively, as shown in FIG. 7D, the control switch 48 may be turned on at a predetermined time (t13) after the signal charge is completely transferred from the photodiode PD to the charge storage section 44 (t12). In this case, the exposure accumulation mode practically extends from t2 to t12. This is because a signal charge generated and accumulated in the photodiode PD during a period of t12 to t13 is swept out to the power supply VDD as the reset drain RD in a reset operation (t0 to t6) in a next frame or swept out to the power supply VDD as the anti-blooming drain ABD by turning on the control switch 48, and therefore the signal charge does not contribute as a pixel signal.

Figure 8A:
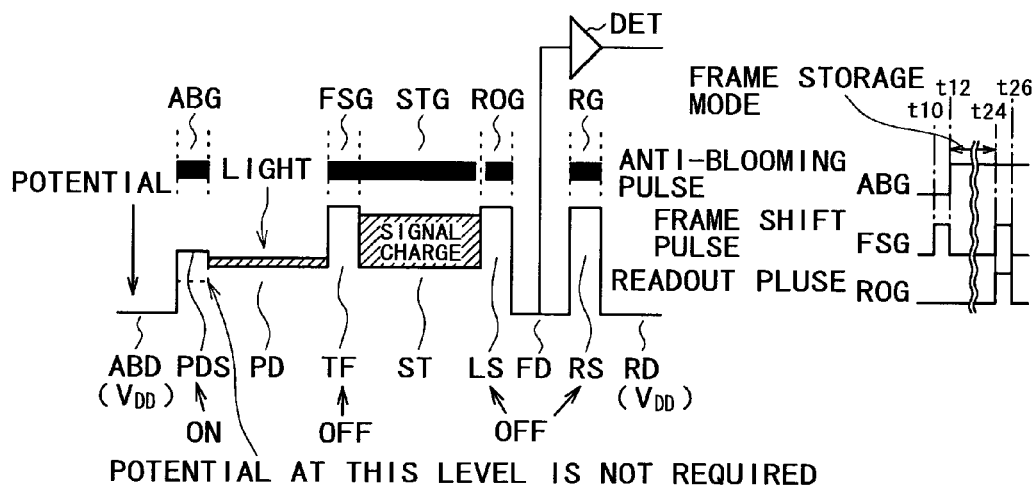
FIGS. 8A and 8B are diagrams of assistance in explaining details of states of operation during a period of t12 to t24 (frame storage mode) in the timing chart shown in FIG. 3.
Figure 8B:
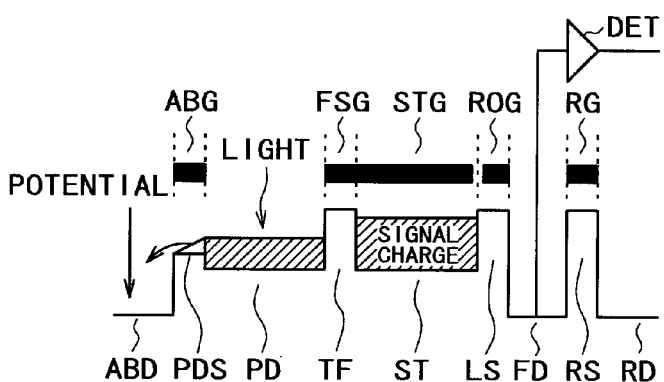

FIGS. 8A and 8B are diagrams of assistance in explaining details of states of operation during the period of t12 to t24 in the timing chart shown in FIG. 3. This period corresponds to a frame storage mode for storing the signal charge transferred to the charge storage section 44 until readout.

In the frame storage mode, both the transfer gate section 46 and the reading selection transistor 34 with the charge storage section 44 interposed therebetween are in an off state, so that as shown in FIG. 8A, the periphery of the charge storage section 44 has a low potential and the charge storage section 44 has a high potential, thus forming a charge well with the charge storage section 44 at the center. Thus, the signal charge transferred from the photodiode PD to the charge storage section 44 remains retained in the charge storage section 44.

The control switch 48 in the frame storage mode is in an on state. Therefore a charge generated by the photodiode PD being exposed to light during this period can be swept out to the power supply VDD as the anti-blooming drain ABD via the control switch 48. However, when the control switch 48 is closed more securely at an off time than the transfer gate section 46 is closed at an off time so that the amount of accumulated saturation charge (maximum amount of signal charge that can be accumulated in the photodiode PD) is defined preferentially by the transfer gate section 46 rather than the control switch 48, since there is a limit to a voltage dynamic range for on-off control, the voltage potential of the control switch 48 when the control switch 48 is turned on practically tends to be higher than the potential of the transfer gate section 46 at the off time but lower than the voltage potential of the photodiode PD, as shown in FIG. 8A.

Thus, when a small amount of charge is generated by the photodiode PD being exposed to light in this frame storage mode, the charge is not swept out to the power supply VDD as the anti-blooming drain ABD via the control switch 48. In the meantime, since the transfer gate section 46 is in the off state and the potential of the control switch 48 at the on time is higher than the potential of the transfer gate section 46 at the off time, the charge is not swept out to the charge storage section 44 side either. The charge generated in the frame storage mode therefore remains stored in the photodiode PD.

When intense light enters the photodiode PD, on the other hand, as shown in FIG. 8B, a resulting charge more than the amount of charge that the control switch 48 at the on time can accumulate by the electric barrier is passed from the photodiode PD through the control switch 48 (anti-blooming gate ABG) at the on time, and then swept out to the power supply VDD as the anti-blooming drain ABD. It is thereby possible to prevent quasi-blooming in the frame storage mode.

Thus, from a viewpoint of preventing quasi-blooming in the frame storage mode, the photodiode PD does not need to be emptied out of the charge when the control switch 48 is turned on; it suffices to set the voltage potential of the control switch 48 when the control switch 48 is turned on to a level such that the charge does not overflow the photodiode PD into the charge storage section 44 side. That is, it suffices to set the voltage potential such that the electric barrier of the control switch 48 is lower in height than the electric barrier of the transfer gate section 46 in the frame storage mode. Hence, the channel potential of the control switch 48 can be set shallower than when the photodiode PD is depleted.

This means that tolerance for narrow channel effects can be increased and channel width of the MOS transistor PDS forming the control switch 48 can be narrowed. This in turn means that accuracy of fabrication of the MOS transistor PDS and an impurity dose may be rough.

Figure 9A:
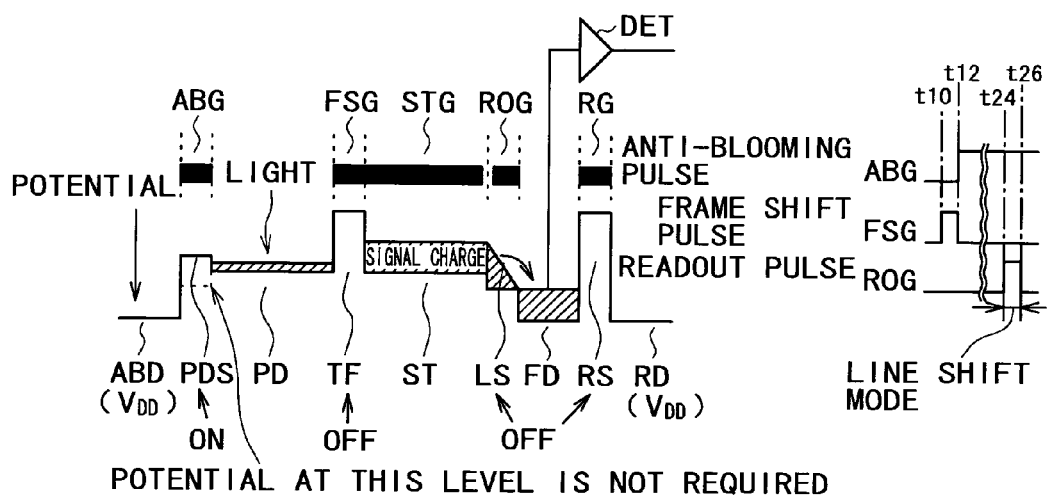
FIGS. 9A and 9B are diagrams of assistance in explaining details of states of operation during a period of t24 to t26 (line shift mode) in the timing chart shown in FIG. 3.
Figure 9B:
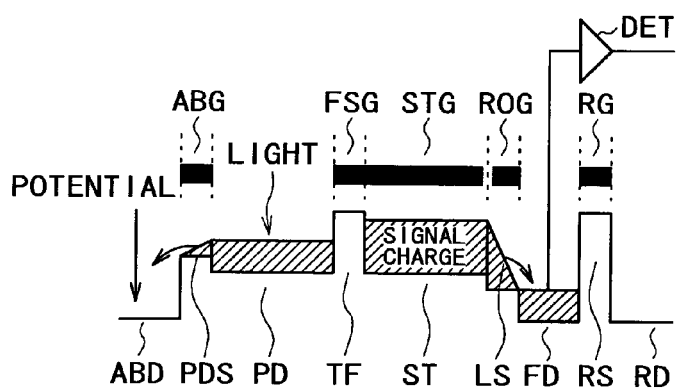

FIGS. 9A and 9B are diagrams of assistance in explaining details of states of operation during the period of t24 to t26 in the timing chart shown in FIG. 3. This period corresponds to a line shift mode for transferring the signal charge stored in the charge storage section 44 to the floating diffusion 38. In this line shift mode, the transfer gate section 46 is in an off state, and the reading selection transistor 34 is in an on state. Thus, as described above with reference to FIG. 5A, the potential forms a stepwise structure in the transfer gate section 46, the charge storage section 44, and the reading selection transistor 34 in such a manner as to increase in that order. The signal charge stored in the charge storage section 44 is transferred to the floating diffusion 38 side having a shallower electric barrier, and then converted into a pixel signal by the pixel signal generating section 5.

Also in the line shift mode, the control switch 48 is in an on state. Therefore, as in the frame storage mode, a charge generated by the photodiode PD being exposed to light during this period can be swept out to the power supply VDD as the anti-blooming drain ABD via the control switch 48. When intense light enters the photodiode PD, as shown in FIG. 9B, a resulting charge more than the amount of charge that the control switch 48 at the on time can accumulate by the electric barrier is passed from the photodiode PD through the control switch 48 (anti-blooming gate ABG) at the on time, and then swept out to the power supply VDD as the anti-blooming drain ABD. It is thereby possible to prevent quasi-blooming also in the line shift mode.

After completion of the line shift mode, the voltage potentials of the control switch 48, the photodiode PD, and the transfer gate section 46 are the same as in the frame storage mode. Thus, when intense light enters the photodiode PD in a period after the pixel signal is obtained and before a start of operation for exposure accumulation of signal charge for a next frame, as shown in FIG. 8B and FIG. 9B, a charge more than the amount of charge that the control switch 48 at the on time can accumulate by the electric barrier is generated in the photodiode PD, and the charge is passed from the photodiode PD through the control switch 48 (anti-blooming gate ABG) at the on time, and then swept out to the power supply VDD as the anti-blooming drain ABD. It is thereby possible to prevent quasi-blooming also in the period after the pixel signal is obtained and before the start of operation for exposure accumulation of signal charge for the next frame.

As described above, the solid-state image pickup device 1 according to the above-described embodiment includes a structure obtained by adding the charge storage section 44, the transfer gate section 46 as the gate (frame shift gate FSG) for transfer to the charge storage section 44, and the control switch 48 as the anti-blooming gate ABG to a CMOS sensor of a four-transistor pixel as the unit pixel 3 forming the image pickup unit 10. By keeping the control switch 48 on during the period other than the exposure accumulation period (t2 to t12) for the photodiode PD, it is possible to prevent a charge generated when light enters the photodiode PD from appearing as a pixel signal, while realizing the global shutter function. That is, the global shutter function and the quasi-blooming prevention function can be made compatible with each other.

The control switch 48 as the anti-blooming gate ABG is similar to the overflow control structure in a CCD type solid-state image pickup device, but is different in terms of a control method. Specifically, the CCD type solid-state image pickup device controls an amount of saturation charge by overflow control. On the other hand, when the CMOS sensor with the electronic global shutter function has the charge storage section 44 between the photodiode PD and the floating diffusion 38, it is necessary to control the transfer of charge being stored in the charge storage section 44 and signal charge generated in the photodiode PD. In interlocked relation with this control, the control switch 48 is controlled by switching. Even under this control, the control switch 48 does not take precedence in controlling the amount of saturation charge.

Figure 10A:
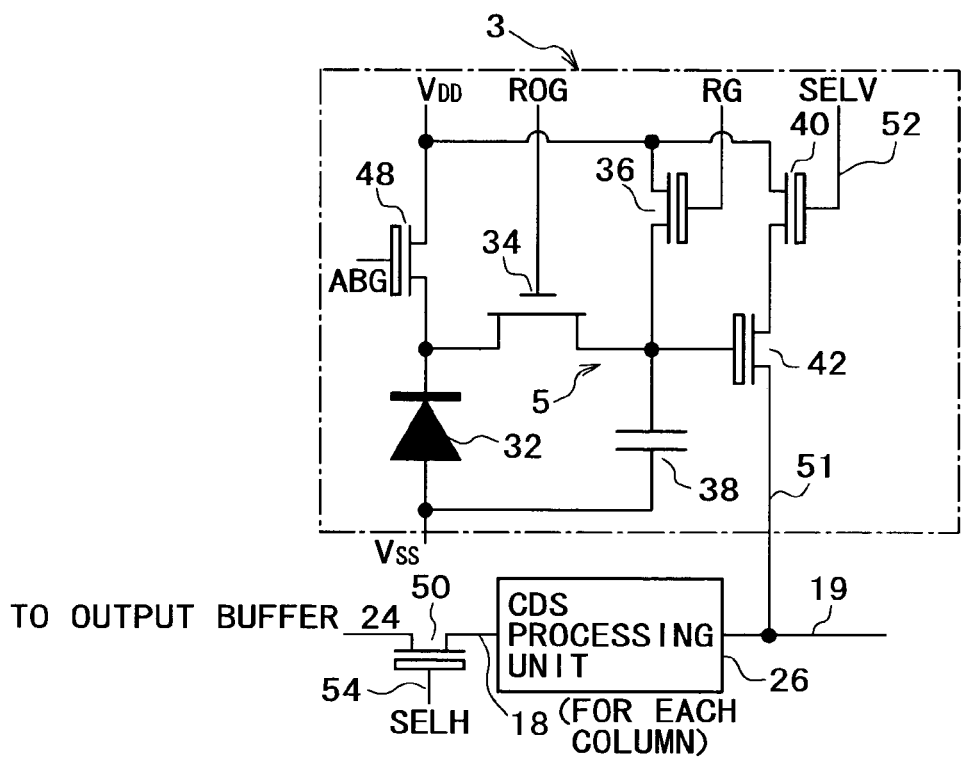
FIGS. 10A and 10B are diagrams showing a detailed example of a second embodiment of a unit pixel in the image pickup unit of the solid-state image pickup device shown in FIG. 1.
Figure 10B:
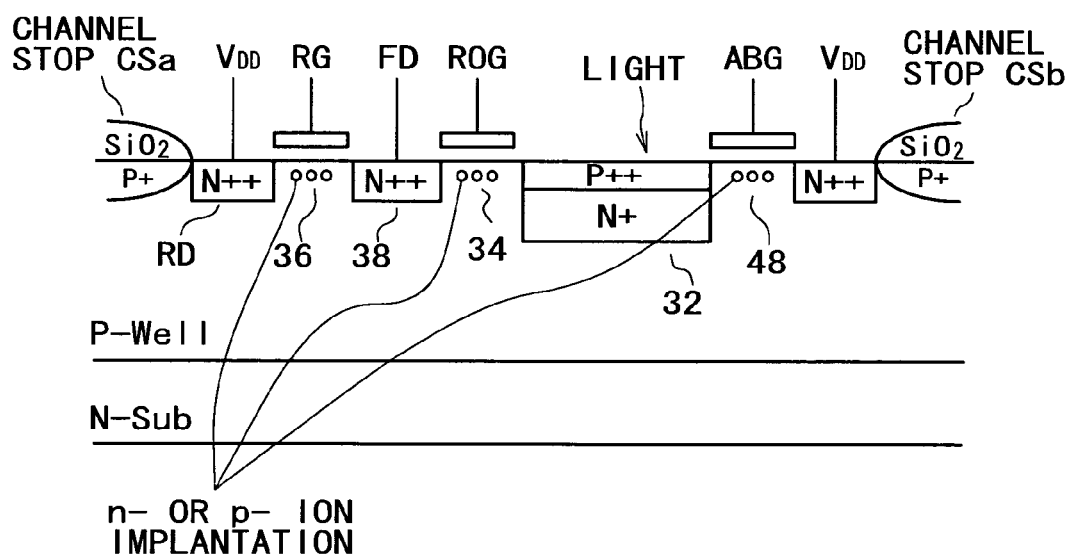

FIGS. 10A and 10B are diagrams showing a detailed example of a second embodiment of a unit pixel 3 in the image pickup unit 10 of the solid-state image pickup device 1 shown in FIG. 1. FIG. 10A is a diagram of a fundamental equivalent circuit of the unit pixel 3 (partly including a peripheral section); and FIG. 10B is a sectional view of the unit pixel 3.

While the unit pixel 3 according to the first embodiment is characterized by including the floating diffusion 38 and the charge storage section 44 as a charge storage part for retaining a signal charge generated in the charge generating section 32 (photodiode PD) for a certain period after the signal charge is transferred simultaneously in all the pixels to realize the global shutter function, the unit pixel 3 according to the second embodiment is characterized in that the function of the charge storage section 44 is performed by a floating diffusion 38 alone. In this case, a readout gate ROG performs the function of the frame shift gate FSG.

As shown in FIG. 10A, the unit pixel 3 according to the second embodiment includes: a charge generating section 32 having both a function of photoelectric conversion for converting light into charge and a charge accumulating function for accumulating the charge; four MOS transistors, that is, a reading selection transistor 34, a reset transistor 36, a vertical selection transistor 40, and an amplifying transistor 42 for the charge generating section 32; and a pixel signal generating section 5 of an FDA configuration including the floating diffusion 38.

As with the unit pixel 3 according to the first embodiment, the unit pixel 3 according to the second embodiment further includes a control switch 48 as an example of a gate section switchable to block a flow of signal charge generated in the charge generating section 32, according to a voltage potential (height of an electric barrier). A power supply VDD performs the function of a drain section disposed on an opposite side of the control switch 48 from the charge generating section 32 for receiving signal charge swept out of the charge generating section 32 through the control switch 48.

Figure 11:
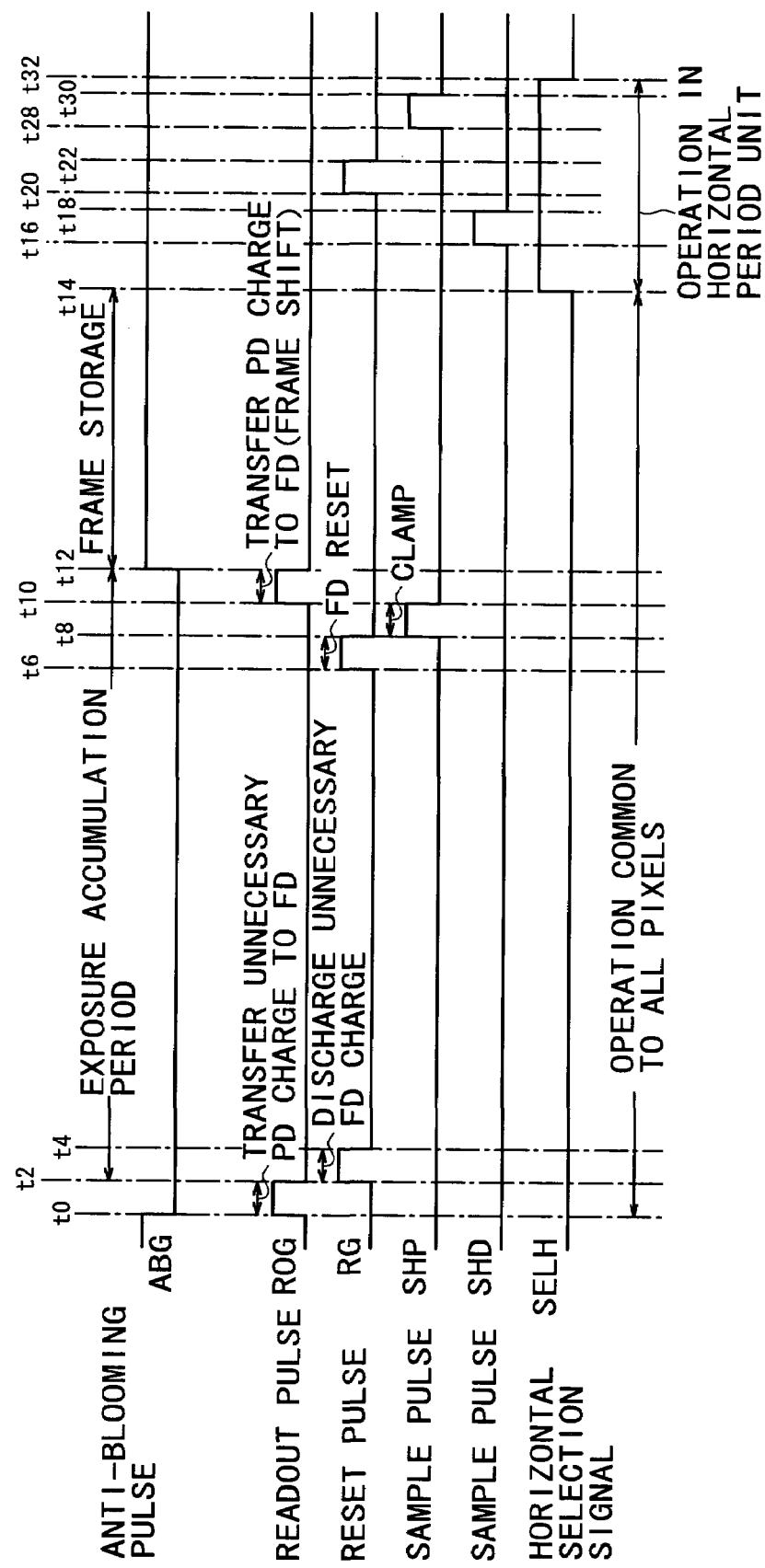
FIG. 11 is an example of a timing chart of scanning in the solid-state image pickup device having the unit pixel according to the second embodiment.

FIG. 11 is an example of a timing chart of scanning in the solid-state image pickup device 1 having the unit pixel 3 according to the second embodiment.

First, before the photodiode PD of the charge generating section 32 is exposed to light to accumulate a signal charge in the photodiode PD, an anti-blooming pulse is inactivated (L; low) to turn off the control switch 48 and a readout pulse is activated (H; high) to turn on the reading selection transistor 34, whereby an undesired charge (unnecessary charge) accumulated in the photodiode PD at this time is swept out to the floating diffusion 38 side (t0 to t2). Thereafter closing the reading selection transistor 34 as a gate function part between the photodiode PD and the floating diffusion 38, exposure accumulation is started. These operations are performed substantially simultaneously in all pixels.

In parallel with the state of exposure accumulation, a reset pulse is activated to turn on the reset transistor 36, whereby the floating diffusion 38 is reset to the potential of the power supply VDD through the reset transistor 36. Thereby, the unnecessary charge transferred from the charge generating section 32 to the floating diffusion 38 via the reading selection transistor 34 is swept out to the power supply VDD. It suffices to complete this operation before completion of accumulation of signal charge. While in FIG. 11, the reset pulse is activated in a period of t2 to t4, the operation is not limited to this example, and may be performed at positions somewhat shifted to the right side in the figure.

Next, before transferring a signal charge obtained in the charge generating section 32 to the floating diffusion 38 simultaneously in all the pixels (frame shift), the floating diffusion FD is cleared again. Hence, before activating the readout pulse at the time of completion of the exposure accumulation, the reset pulse is activated to turn on the reset transistor 36 (t6 to t8).

Next, in order to transfer the signal charge obtained in the charge generating section 32 to the floating diffusion 38 simultaneously in all the pixels, the readout pulse is activated to thereby transfer the signal charge generated by exposing the photodiode PD to light to the floating diffusion FD substantially simultaneously in all the pixels while the anti-blooming pulse is inactivated to maintain an off state of the control switch 48 (t10 to t12). Thereafter the anti-blooming pulse is activated to turn on the control switch 48 substantially simultaneously in all the pixels (t12).

Thereby the signal charge is injected into the floating diffusion FD, and a potential change corresponding to a charge amount of the signal charge appears in the floating diffusion FD.

Next, at a predetermined time after the signal charge is transferred from the charge generating section 32 to the floating diffusion 38, a horizontal selection signal for a pixel to be read at a predetermined position in an arbitrary horizontal line is activated to thereby turn on a horizontal selection transistor 50 while the control switch 48 is maintained in an on state (t14).

Then, by activating a sample pulse SHD, a CDS processing unit 26 retains a pixel signal level corresponding to the amount of signal charge (t16 to t18). Thereafter the reset transistor 36 is turned on by activating the reset gate pulse to clear the floating diffusion FD, and then the reset gate pulse is inactivated (t20 to t22). By activating a sample pulse SHP in this state, the CDS processing unit 26 retains a pixel signal level (reset level) at the time of clearing the floating diffusion FD (t28 to t30). The horizontal selection signal is thereafter inactivated (t32). The CDS processing unit 26 removes fixed pattern noise FPN and reset noise by obtaining a difference between the reset level obtained by the sample pulse SHP and the pixel signal level obtained by the sample pulse SHD.

Thus, the configuration of the unit pixel 3 according to the second embodiment also enables the global shutter function. As in the first embodiment, the control switch 48 is kept on during a period other than the exposure accumulation period (t2 to t12) for the photodiode PD. It is therefore possible also with the configuration of the second embodiment to prevent a charge generated when intense light enters the photodiode PD from appearing as a pixel signal, while realizing the global shutter function. That is, the global shutter function and the blooming prevention function can be made compatible with each other.

Incidentally, with the configuration of the unit pixel 3 according to the second embodiment, timing of transfer of signal charge to the floating diffusion 38 may differ in each pixel, as in the case of an ordinary driving control method. That is, it is possible not to use the global shutter function in a structure as of the unit pixel 3 according to the second embodiment. Even in this case, it is possible to realize effects of the control switch 48, that is, the blooming prevention function of preventing a charge generated when intense light enters the photodiode PD from appearing as a pixel signal.

While the foregoing embodiments have been described by taking as an example the pixel signal generating section 5 of an FDA configuration using the floating diffusion as an example of a charge injection section, the pixel signal generating section 5 does not necessarily need to be of the FDA configuration. The pixel signal generating section 5 may be of a configuration of a detecting system in which a floating gate FG as an example of a charge injection section is provided to a substrate under a transfer electrode, and a change in potential of the floating gate FG which change is caused by an amount of signal charge passing through a channel under the floating gate FG is used.

Also, while the charge storage section 44 has been described as having a transfer electrode, the charge storage section 44 may be of a virtual gate VG structure without a transfer electrode.

Further, while the foregoing embodiments have been described by taking as an example a column type solid-state image pickup device in which signal outputs from pixels arranged in the form of rows and columns are voltage signals, and a CDS processing function unit is provided for each column. However, the solid-state image pickup device is not limited to the column type. For example, it is possible to provide the unnecessary charge discharging gate section to a solid-state image pickup device in which signal outputs from pixels are current signals.

Further, while description has been made of the solid-state image pickup devices according to the foregoing embodiments in which the components of the driving control unit 7 such as the horizontal scanning circuit 12 and the vertical scanning circuit 14 are formed integrally with the image pickup unit 10 in a semiconductor region of single-crystal silicon or the like, the image pickup unit 10 and the driving control unit 7 may be separate from each other. Alternatively, only a part of the driving control unit 7 shown in the foregoing embodiments may be formed integrally with the image pickup unit 10. It is desirable in this case that the parts of the horizontal scanning circuit 12, the vertical scanning circuit 14, and a vertical column selection driving unit 16 be integrated with the image pickup unit 10.

While the present invention has been described above using the embodiments thereof, the technical scope of the present invention is not limited to that described in the foregoing embodiments. Various changes or modifications can be made to the foregoing embodiments without departing from the spirit of the invention, and the technical scope of the present invention also includes embodiments to which such changes or modifications are made.

Further, the foregoing embodiments do not limit the invention covered in claims, and not all combinations of features described in the embodiments are necessarily essential to the solving means of the invention. The foregoing embodiments include inventions in various stages, and various inventions can be extracted by appropriate combinations of a plurality of structural requirements disclosed. Even when some structural requirements are eliminated from all structural requirements disclosed in the embodiments, as long as the effects are obtained, a structure resulting from eliminating the some structural requirements can be extracted as invention.

What is claimed is:

1. A solid-state image pickup device comprising:
a plurality of pixels, each pixel having at least:
a charge generating section for generating a charge,
a charge storage section for storing said charge generated by said charge generating section,
a transfer gate disposed between said charge generating section and said charge storage section, for transferring said charge generated by said charge generating section to said charge storage section, and
a pixel signal generating section for generating a pixel signal corresponding to said charge stored in said charge storage section;
an unnecessary charge discharging gate in each pixel disposed on an opposite side of said charge generating section from said charge storage section, switchable to selectively allow discharge of an unnecessary charge that is generated in said charge generating section; and
an unnecessary charge drain section disposed on an opposite side of said unnecessary charge discharging gate from said charge generating section, for receiving said unnecessary charge.

2. The solid-state image pickup device as claimed in claim 1,
wherein said transfer gate transfers said charge generated by said charge generating section to said charge storage section simultaneously in each one of the plurality of said pixels.

3. The solid-state image pickup device as claimed in claim 1,
wherein said pixel signal generating section comprises:
a charge injection section into which said charge generated by said charge generating section is injected,
a readout gate for controlling injection of said charge into said charge injection section,
a detecting element for detecting a change in potential of said charge injection section,
a reset drain section for receiving said charge injected into said charge injection section, and
a reset gate for resetting the potential of said charge injection section by discharging said signal charge injected into said charge injection section to said reset drain section.

4. The solid-state image pickup device as claimed in claim 3, wherein said charge injection section also serves as said charge storage section.

5. The solid-state image pickup device as claimed in claim 1, further comprising a driving control unit for driving control of said unnecessary charge discharging gate of said pixel,
wherein said driving control unit controls the height of an electric barrier at said unnecessary charge discharging gate by changing a magnitude of a voltage applied to said unnecessary charge discharging gate at a predetermined timing.

6. The solid-state image pickup device as claimed in claim 5,
wherein said driving control unit effects control to change the magnitude of the voltage applied to said unnecessary charge discharging gate such that an electric barrier created by said unnecessary charge discharging gate is high during a time of charge accumulation, and the electric barrier is low during a period other than said time of charge accumulation.

7. The solid-state image pickup device as claimed in claim 6,
wherein said driving control unit sets the magnitude of said voltage such that the electric barrier under said unnecessary charge discharging gate is higher in height than an electric barrier under said transfer gate during a period of transfer of said charge from said charge generating section to said charge storage section, and such that the electric barrier under said unnecessary charge discharging gate is lower in height than the electric barrier under said transfer gate during a major part of a period other than said time of charge accumulation.

8. The solid-state image pickup device as claimed in claim 6,
wherein said driving control unit sets the magnitude of said voltage such that the electric barrier under said unnecessary charge discharging gate during said time of charge accumulation is higher in height than an electric barrier under said transfer gate during said time of charge accumulation.

9. The solid-state image pickup device as claimed in claim 1,
wherein said unnecessary charge discharging gate is in a state of storing a charge of an opposite conduction type from said charge generated by said charge generating section at a channel surface under said unnecessary charge discharging gate during a time when said unnecessary charge discharging gate is in an off state.

10. The solid-state image pickup device as claimed in claim 1,
wherein said transfer gate is in a state of storing a charge of an opposite conduction type from said charge generated by said charge generating section at a channel surface under said transfer gate during a time when said transfer gate is in an off state.

11. The solid-state image pickup device as claimed in claim 3,
wherein said readout gate is in a state of storing a charge of an opposite conduction type from said charge generated by said charge generating section at a channel surface under said readout gate during a time when said readout gate is in an off state.

12. The solid-state image pickup device as claimed in claim 3,
wherein said reset gate is in a state of storing a charge of an opposite conduction type from said charge generated by said charge generating section at a channel surface under said reset gate during a time when said reset gate is in an off state.

13. The solid-state image pickup device as claimed in claim 1,
wherein said transfer gate has an electrode to which a pulse signal for driving control of said transfer gate is applied, said charge storage section has an electrode to which a pulse signal for driving control of said charge storage section is applied, and said transfer gate electrode and said storage gate electrode are formed as a common single-gate electrode; and
a voltage potential difference is formed in a part corresponding to said transfer gate electrode and said storage gate electrode.

14. A driving control method for a solid-state image pickup device, said method comprising the steps of:
providing a solid-state image pickup device including a plurality of pixels, each pixel having at least:
a charge generating section for generating a charge,
a charge storage section for storing charge,
a transfer gate section disposed between said charge generating section and said charge storage section, for transferring said charge generated by said charge generating section to said charge storage section, and
a pixel signal generating section for generating a pixel signal corresponding to said charge stored in said charge storage section;
providing an unnecessary charge discharging gate section in each pixel disposed on an opposite side of said charge generating section from said charge storage section, switchable to selectively allow discharge of an unnecessary charge that is generated in said charge generating section;
providing an unnecessary charge drain section disposed on an opposite side of said unnecessary charge discharging gate section from said charge generating section, for receiving said unnecessary charge;
turning off said unnecessary charge discharging gate section during a time of charge accumulation, and
turning on said unnecessary charge discharging gate section during a period other than said time of charge accumulation.

15. The driving control method as claimed in claim 14,
wherein a well for said charge is formed with said charge generating section at a center of the well by turning off said unnecessary charge discharging gate section and said transfer gate section prior to said time of charge accumulation.

16. The driving control method, as claimed in claim 14, wherein prior to said charge accumulation, said charge generating section is reset by discharging said charge accumulated in said charge generating section to at least one of said charge storage section and said unnecessary charge discharging gate section.

17. The driving control method as claimed in claim 14, wherein said charge accumulated in said charge generating section at said time of charge accumulation is transferred to said charge storage section by turning on said transfer gate section, and said unnecessary charge discharging gate section is turned on after a start of transfer of the charge.

18. The driving control method as claimed in claim 17, wherein said transfer gate section is turned off after the transfer of said charge to said charge storage section.

19. The driving control method as claimed in claim 14, wherein said charge storage section is reset by discharging a charge stored in said charge storage section prior to transfer of said accumulated signal charge from the charge generating section to said charge storage section.

20. The driving control method as claimed in claim 14, wherein control is effected such that a charge well is formed with said charge generating section at a center of the charge well when said unnecessary charge discharging gate section is in an on state.

* * * * *